(12) United States Patent
Kiyohara et al.

(10) Patent No.: US 10,461,694 B2
(45) Date of Patent: Oct. 29, 2019

(54) CIRCUIT DEVICE, OSCILLATOR, ELECTRONIC APPARATUS, VEHICLE, AND MANUFACTURING METHOD FOR CIRCUIT DEVICE

(71) Applicant: SEIKO EPSON CORPORATION, Tokyo (JP)

(72) Inventors: Atsushi Kiyohara, Chino (JP); Shinnosuke Kano, Minowa-machi (JP); Shigenori Isozaki, Minowa-machi (JP); Mihiro Nonoyama, Minowa-machi (JP)

(73) Assignee: SEIKO EPSON CORPORATION, Tokyo (JP)

( * ) Notice: Subject to any disclaimer, the term of this patent is extended or adjusted under 35 U.S.C. 154(b) by 0 days.

(21) Appl. No.: 15/899,943

(22) Filed: Feb. 20, 2018

(65) Prior Publication Data

US 2018/0241344 A1    Aug. 23, 2018

(30) Foreign Application Priority Data

Feb. 23, 2017    (JP) .................. 2017-031655

(51) Int. Cl.
| | |
|---|---|
| *H03B 5/04* | (2006.01) |
| *H03B 5/32* | (2006.01) |
| *H03L 1/02* | (2006.01) |
| *H03L 7/00* | (2006.01) |
| *H03M 1/12* | (2006.01) |

(52) U.S. Cl.
CPC ................. *H03B 5/04* (2013.01); *H03B 5/32* (2013.01); *H03L 1/02* (2013.01); *H03L 7/00* (2013.01); *H03M 1/12* (2013.01)

(58) Field of Classification Search
CPC ....................................................... H03B 5/04
USPC ..................................................... 331/70, 176
See application file for complete search history.

(56) References Cited

U.S. PATENT DOCUMENTS

| | | | | |
|---|---|---|---|---|
| 4,922,212 A | * | 5/1990 | Roberts | ............. H03L 1/026 331/158 |
| 5,892,408 A | * | 4/1999 | Binder | ............. H03L 1/026 331/176 |

FOREIGN PATENT DOCUMENTS

| | | |
|---|---|---|
| JP | S64-082809 A | 3/1989 |
| JP | 2011-223404 A | 11/2011 |

* cited by examiner

*Primary Examiner* — Joseph Chang
(74) *Attorney, Agent, or Firm* — Oliff PLC

(57) ABSTRACT

A circuit device includes an A/D conversion circuit that performs A/D conversion on a temperature detection voltage from a temperature sensor so as to output temperature detection data, and a digital signal processing circuit that performs a temperature compensation process on the basis of the temperature detection data, in which the A/D conversion circuit operates in a first mode, and switches to a second mode in a case where a predetermined condition is established.

20 Claims, 20 Drawing Sheets

| D[14:0] | NUMBER OF CLOCKS | | NUMBER OF COMPARISONS | TOTAL NUMBER OF CLOCKS | CONVERSION TIME | |
|---|---|---|---|---|---|---|
| | SAMPLE | COMPARATOR | | | TARGET BIT | INTEGRATION |
| 14<br>13 | 2 | 2 | 2 | 8 | 62.5 | 62.5 |
| 12<br>11 | 2 | 2 | 3 | 12 | 93.75 | 156.25 |
| 10<br>9 | 2 | 2 | 3 | 12 | 93.75 | 250 |
| 8<br>7 | 2 | 2 | 3 | 12 | 93.75 | 343.75 |
| 6<br>5 | 2 | 2 | 3 | 12 | 93.75 | 437.5 |
| 4<br>3 | 2 | 6 | 3 | 24 | 187.5 | 625 |
| 2<br>1 | 4 | 12 | 3 | 48 | 375 | 1000 |
| 0 | 8 | 24 | 2 | 64 | 500 | 1500 |
| | | | | | ($\mu$ sec) | ($\mu$ sec) |

FIG. 13

| "10" | "11" | DETERMINATION RESULT |
|---|---|---|
| up | up | "11" |
| | down | "10" |
| "10" | "01" | DETERMINATION RESULT |
| down | up | "01" |
| | down | "00" |

FIG. 15

| "10" | "11" | "100" | DETERMINATION RESULT |
|---|---|---|---|
| up | up | up | CARRY |
| | up | down | "11" |
| | down | up | |
| | down | down | "10" |
| "10" | "01" | "00" | DETERMINATION RESULT |
| down | up | up | "01" |
| | up | down | "00" |
| | down | up | |
| | down | down | BORROW |

FIG. 16

CIRCUIT DEVICE, OSCILLATOR, ELECTRONIC APPARATUS, VEHICLE, AND MANUFACTURING METHOD FOR CIRCUIT DEVICE

BACKGROUND

1. Technical Field

The present invention relates to a circuit device, an oscillator, an electronic apparatus, a vehicle, and a manufacturing method for the circuit device.

2. Related Art

In the related art, an A/D conversion circuit which performs analog-digital conversion (hereinafter, referred to as A/D conversion) for converting an analog signal to digital data is widely known. As types of A/D conversion circuit, there are various types such as a flash type, a successive comparison type, and a $\Delta\Sigma$ type. For example, JP-A-2011-223404 discloses a method of performing successive comparison type A/D conversion.

There are various circuits using temperature detection data which is a result of A/D conversion of a temperature detection signal (analog signal) from a temperature sensor. For example, in the related art, a temperature compensated crystal oscillator (TCXO) is known. The TCXO is used as, for example, a reference signal source or the like in portable communication terminals, GPS related apparatuses, wearable apparatuses, on-vehicle apparatuses, and the like. A technique disclosed in JP-A-64-82809 is known as related art for a DTCXO which is a digital type temperature compensated oscillator.

In the TCXO, in a case where a frequency drift occurs, there may be various problems (for example, cancellation of GPS locking). Thus, there is the need for suppressing variations in outputs in an A/D conversion circuit. On the other hand, if a variation in an A/D conversion result is suppressed even in a case where a sudden temperature change or the like occurs, it takes time for temperature detection data which is an A/D conversion result to reach an appropriate value. As a result, a long waiting time is required for an oscillation frequency to converge on a desired value.

SUMMARY

An advantage of some aspects of the invention is to provide a circuit device, an oscillator, an electronic apparatus, a vehicle, and a manufacturing method for the circuit device, capable of performing appropriate A/D conversion corresponding to situations by switching between a plurality of modes.

An aspect of the invention relates to a circuit device including an A/D conversion circuit that performs A/D conversion on a temperature detection voltage from a temperature sensor so as to output temperature detection data; and a digital signal processing circuit that performs a temperature compensation process on the basis of the temperature detection data, in which the A/D conversion circuit operates in a first mode so as to obtain the temperature detection data by performing an A/D conversion process according to a first A/D conversion method, and switches to a second mode so as to obtain the temperature detection data by performing an A/D conversion process according to a second A/D conversion method which is different from the first A/D conversion method in a case where a predetermined condition is established.

In the aspect of the invention, when temperature detection data used for a temperature compensation process is obtained, the A/D conversion circuit switches an A/D conversion method (mode) from the first A/D conversion method to the second A/D conversion method in a case where a predetermined condition is established. In the above-described way, the A/D conversion circuit can be appropriately operated depending on situations.

In the aspect of the invention, in a case where the minimum resolution of data in A/D conversion is indicated by LSB, the first A/D conversion method may be a process of obtaining the temperature detection data such that a change in the temperature detection data at a second output timing following a first output timing with respect to the temperature detection data at the first output timing is equal to or less than k×LSB (where k is a positive integer satisfying k<j; and j is a positive integer representing a resolution in A/D conversion).

With this configuration, it is possible to prevent a sudden change in temperature detection data and thus to minimize defects caused by the change.

In the aspect of the invention, the A/D conversion circuit may include a register portion in which intermediate result data or final result data is stored as result data, a D/A converter that performs D/A conversion on the result data so as to output a D/A conversion voltage, a comparison circuit that compares the temperature detection voltage from the temperature sensor with the D/A conversion voltage from the D/A converter, and a processing circuit that performs a determination process on the basis of a comparison result in the comparison circuit, and performs an update process of the result data on the basis of the determination process, and the processing circuit may output the final result data which is a result of the update process as the temperature detection data.

With this configuration, it is possible to obtain temperature detection data by updating result data through a determination process based on a comparison result.

In the aspect of the invention, the second A/D conversion method may be a process in which the determination process is performed on an MSB side of the result data in a first determination period, and the determination process on an LSB side of the result data is performed in a second determination period which is longer than the first determination period.

With this configuration, since a determination period suitable for each bit (bit range) can be set, it is possible to realize highly accurate A/D conversion at a high speed.

In the aspect of the invention, the circuit device may further include an interface; and a storage unit to which circuit constant setting information of the circuit device is written via the interface, and the A/D conversion circuit may switch to the second mode in a case where the circuit constant setting information is written via the interface.

With this configuration, the circuit constant setting information being written to the storage unit can be used as a trigger of switching to the second mode.

In the aspect of the invention, the circuit constant setting information may be at least one of reference voltage adjustment information, reference current adjustment information, and oscillation frequency adjustment information.

With this configuration, at least one of the reference voltage adjustment information, the reference current adjustment information, and the oscillation frequency adjustment information can be used as the circuit constant setting information.

In the aspect of the invention, the circuit device may further include an interface, and the A/D conversion circuit may switch to the second mode in a case where a command for switching to the second mode is input via the interface.

With this configuration, the switching command being input can be used as a trigger of switching to the second mode.

In the aspect of the invention, the A/D conversion circuit may switch to the second mode on the basis of a switching signal from the interface.

With this configuration, a switching signal for switching to the second mode can be output from the interface.

In the aspect of the invention, the A/D conversion circuit may include a temperature change detection circuit, and switch to the second mode in a case where a predetermined temperature change is detected by the temperature change detection circuit.

With this configuration, a temperature change being detected can be used as a trigger of switching to the second mode.

In the aspect of the invention, the A/D conversion circuit may switch to the second mode in a case where the predetermined condition is established, and switch to the first mode after the temperature detection data which is an A/D conversion result in the second mode is output.

With this configuration, rapid return to the first mode is possible after switching to the second mode.

In the aspect of the invention, the A/D conversion circuit may operate in the second mode in an activation period, and switch to the first mode after the temperature detection data which is an A/D conversion result in the second mode is output, and switch to the second mode in a case where the predetermined condition is established after switching to the first mode occurs.

With this configuration, the A/D conversion circuit can be operated in an appropriate mode even in the activation period.

In the aspect of the invention, the circuit device may further include an oscillation signal generation circuit, and the digital signal processing circuit may perform a temperature compensation process on an oscillation frequency from the oscillation signal generation circuit on the basis of the temperature detection data, and output frequency control data of the oscillation frequency. The oscillation signal generation circuit may generate an oscillation signal with the oscillation frequency set by the frequency control data by using the frequency control data from the digital signal processing circuit and a resonator.

With this configuration, it is possible to output an oscillation signal with a stable frequency regardless of a temperature.

Another aspect of the invention relates to an oscillator including the circuit device; and the resonator.

Still another aspect of the invention relates to an electronic apparatus including anyone of the circuit devices.

Still another aspect of the invention relates to a vehicle including any one of the circuit devices.

Still another aspect of the invention relates to a manufacturing method for a circuit device which performs A/D conversion on a temperature detection voltage from a temperature sensor, so as to output temperature detection data, and includes an A/D conversion circuit, a storage unit, and an interface, the method including performing measurement for determining circuit constant setting information; and causing an operation of the A/D conversion circuit to switch from a first mode in which an A/D conversion process is performed according to a first A/D conversion method in order to obtain the temperature detection data to a second mode in which an A/D conversion process is performed according to a second A/D conversion method which is different from the first A/D conversion method in order to obtain the temperature detection data, when the circuit constant setting information is written to the storage unit via the interface on the basis of a result of the measurement.

BRIEF DESCRIPTION OF THE DRAWINGS

The invention will be described with reference to the accompanying drawings, wherein like numbers reference like elements.

FIG. 13 illustrates an example of setting a determination period in a high speed mode.

FIG. 15 illustrates a specific example of a determination process.

FIG. 16 illustrates a specific example of a determination process.

DESCRIPTION OF EXEMPLARY EMBODIMENTS

Figure 1:
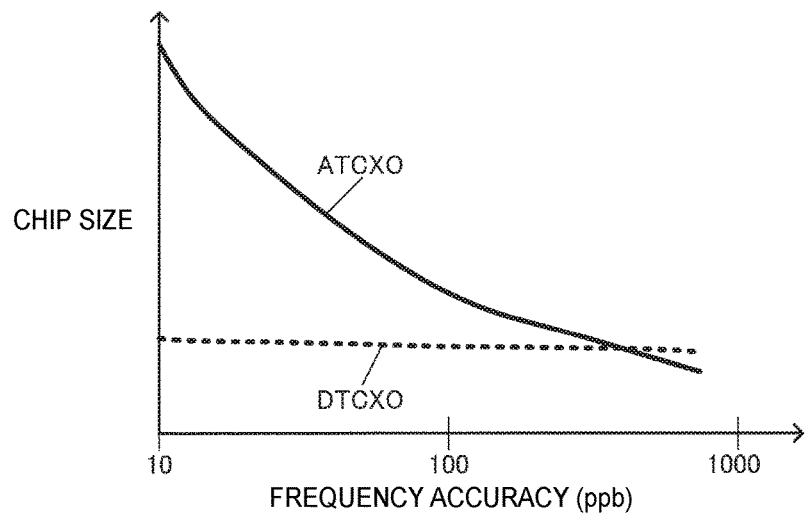
FIG. 1 is a diagram illustrating relationships between chip sizes of an ATCXO and a DTCXO and accuracy.

Hereinafter, preferred embodiments of the invention will be described in detail. The present embodiment described below is not intended to improperly limit the content of the invention disclosed in the appended claims, and all constituent elements described in the present embodiment are not essential as solving means of the invention.

1. Technique of Present Embodiment 1.1 Overview of Frequency Drift

First, a technique of the present embodiment will be described. There is a circuit device which acquires digital data by A/D-converting a predetermined analog signal, particularly, a circuit device which performs various processes, for example, in a digital signal processing circuit (for example, a digital signal processor (DSP)) on the basis of the digital data. As an example, there is a DTCXO which performs a temperature compensation process of a frequency through digital processing on the basis of temperature detection data which is an A/D conversion result of a temperature detection voltage from a temperature sensor.

In a digital type oscillator such as a DTCXO, there is a problem in that a communication error or the like occurs in a communication device provided with the oscillator due to a drift of an oscillation frequency. In the digital type oscillator, a temperature detection voltage from a temperature sensor is A/D-converted, a temperature compensation process is performed on frequency control data on the basis of obtained temperature detection data, and an oscillation signal is generated on the basis of the frequency control data. In this case, if a value of the frequency control data greatly changes due to a temperature change, it has been proved that a problem of frequency hopping occurs due to this. If the frequency hopping occurs, a problem occurs that, for example, GPS locking in a GPS related communication device is canceled. In order to minimize the occurrence of such a problem, it is necessary to reduce a change in temperature detection data used for the temperature compensation process. As will be described later, frequency hopping may be minimized through processing in portions (for example, processing in a digital signal processing circuit) other than an A/D conversion portion, and such techniques may be used in combination of each other in the circuit device of the present embodiment.

Hereinafter, a brief description will be made of a problem of a frequency drift which may occur in a case where a digital type DTCXO is employed as a TCXO. In the TCXO which is a temperature compensated oscillator, there are requests for improvement of frequency accuracy and low power consumption. For example, in a wearable apparatus such as a GPS-built wristwatch or an apparatus measuring biological information such as a pulse wave, it is necessary to increase a continuous operation time using a battery. Thus, it is required for the TCXO as a reference signal source to secure frequency accuracy and also to consume less power.

Various methods have been proposed as communication methods between a communication terminal and a base station. For example, in a time division duplex (TDD) method, each apparatus transmits data in an allocated time slot. A guard time is set between time slots (an uplink slot and a downlink slot), and thus overlapping between time slots is prevented. In a communication system of the next generation, a technique is proposed in which data communication is performed in the TDD method by using a single frequency bandwidth (for example, 50 GHz).

However, in a case where such a TDD method is employed, it is necessary for each apparatus to perform time synchronization, and thus an accurate absolute time is required to be measured. In order to realize such a request, for example, there may be a technique in which an atomic clock (atomic oscillator) is provided in each apparatus as a reference signal source, but a problem such as causing high cost or a large-sized apparatus occurs.

In a case where an analog type TCXO (ATCXO) is used as a reference signal source, if frequency accuracy is to be increased, as illustrated in FIG. 1, a chip size of a circuit device increases, and thus it is hard to realize low cost or low power consumption. On the other hand, the DTCXO has an advantage in that frequency accuracy can be increased without increasing a chip size of a circuit device as illustrated in FIG. 1.

However, since there is the above-described problem such as a frequency drift, various circuit methods have been proposed for a digital type oscillator such as the DTCXO, but the digital type oscillator is scarcely employed as a reference signal source of an actual product in which the communication error is problematic, and the present situation is that an analog type oscillator such as an ATCXO is employed.

Figure 2:
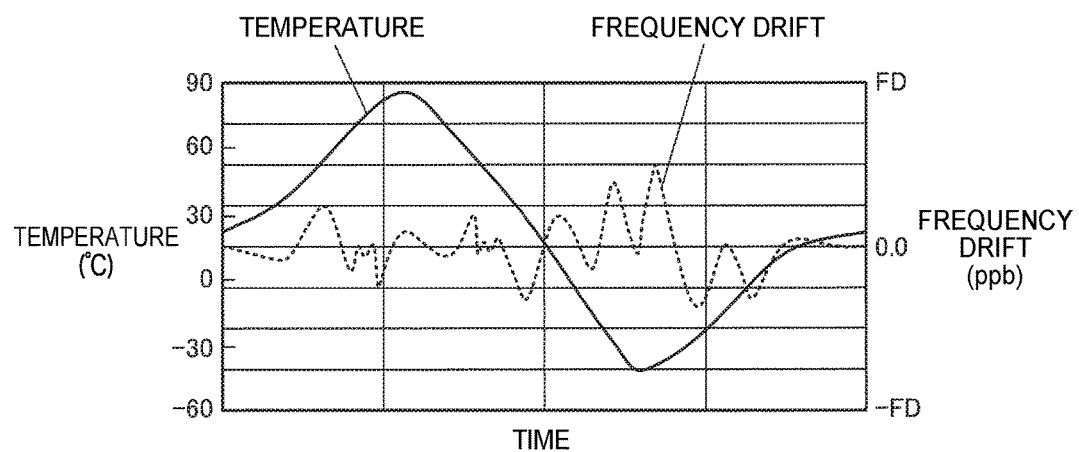
FIG. 2 illustrates an example of a frequency drift of the ATCXO.

For example, FIG. 2 is a diagram illustrating a frequency drift in the ATCXO. In the ATCXO, as illustrated in FIG. 2, even in a case where a temperature changes over time, a frequency drift thereof enters an allowable frequency drift (allowable frequency error) range (±FD). In FIG. 2, the frequency drift (frequency error) is indicated by a proportion (frequency accuracy, ppb) with respect to a nominal oscillation frequency (for example, about 16 MHz). For example, in order not to cause a communication error, a frequency drift is required to be included in the allowable frequency drift range (±FD) within a predetermined period TP (for example, 20 msec). Here, the FD is, for example, about several ppb.

Figure 3:
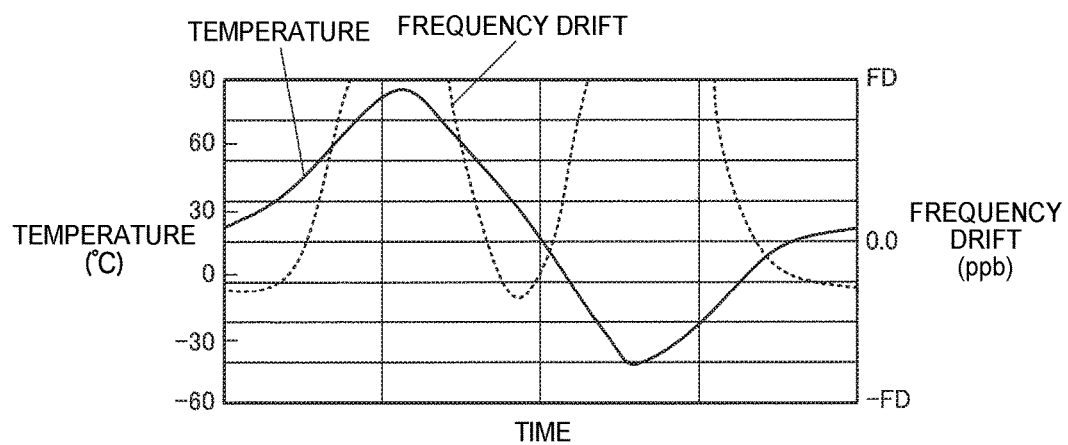
FIG. 3 illustrates an example of a frequency drift of the DTCXO.

On the other hand, FIG. 3 is a diagram illustrating a frequency drift in a case where a DTCXO of the related art is used. As illustrated in FIG. 3, in the DTCXO of the related art, frequency hopping occurs in which a frequency drift thereof does not enter the allowable frequency drift range and exceeds the range. Thus, a communication error (unlocking of a GPS) occurs due to the frequency hopping, and this hinders the DTCXO from being employed as a reference signal source of an actual product.

A circuit device using A/D conversion result data, particularly, temperature detection data DTD into which a temperature detection voltage VTD is A/D-converted is not limited to the DTCXO. For example, it is known that an output from a gyro sensor has temperature characteristics, and an error occurs in output data due to the temperature characteristics. Thus, a process (for example, a zero point correction process) of compensating for the temperature characteristics of the output from the gyro sensor may be performed on the basis of the temperature detection data DTD, and a circuit device in the present embodiment may be used for the gyro sensor.

1.2 Overview of First A/D Conversion Method (First Mode or Normal Operation Mode)

Therefore, in the present embodiment, a first A/D conversion method in which a variation in an output (A/D conversion result data or temperature detection data) is relatively small is used as an A/D conversion method.

Specifically, in a case where the minimum resolution of data in A/D conversion is indicated by LSB, the first A/D conversion method is a process of obtaining temperature detection data such that a change in second temperature detection data at a second output timing following a first output timing with respect to first temperature detection data at the first output timing is equal to or less than k×LSB (where k is a positive integer satisfying k<j; and j is a positive integer representing a resolution in A/D conversion).

The output timing here indicates a timing at which a single item of A/D conversion result data is output, and, for example, in a case where A/D conversion is performed in 15 bits, the output timing indicates a timing at which A/D conversion result data with 15-bit accuracy is output. In the present embodiment, a plurality of comparison processes are performed by using latent values (intermediate result data), and A/D conversion result data (final result data) with 15-bit accuracy is obtained on the basis of results of the plurality of comparison processes. In other words, in order to output a single item of temperature detection data, a single item or a plurality of items of intermediate result data are output as results of a plurality of comparison processes. An output timing of the intermediate result data may include an output timing in the A/D conversion process in a broad sense, but, the "output timing" here indicates an output timing of only final A/D conversion result data (temperature detection data with 15-bit accuracy), and does not indicate an output timing of the intermediate result data.

The integer j indicating a resolution in A/D conversion is a value which depends on the number of bits of A/D conversion result data, and, in a case where the number of bits is p, j may be $2^p$.

In the above-described way, a change in A/D conversion result data (in a narrow sense, temperature detection data DTD) at two timings adjacent to each other is restricted to k×LSB or less. Since LSB here indicates the minimum resolution of data in the A/D conversion, for example, in a case where a temperature range from T1° C. to T2° C. (>T1) is expressed by p-bit digital data, a change in 1LSB represents a change in temperature corresponding to (T2−T1)/2° C. In a case where this condition is not provided, A/D conversion result data may change by a maximum of $2^p(=j)$ LSB. The change of $2^p$LSB corresponds to a case where A/D conversion result data at the first timing becomes an expected minimum value (maximum value), and A/D conversion result data at the second timing becomes an expected maximum value (minimum value).

Consequently, in the example of the DTCXO, a change in the temperature detection data is suppressed, and thus there is a high probability that frequency hopping may also enter the allowable frequency drift range. Also in examples other than the DTCXO, a change in the A/D conversion result data is suppressed, and thus it is possible to reduce the occurrence of defects.

It is known that a temperature change (a change in the environmental temperature) under a natural condition is not great, and, for example, a temperature change of about 0.28° C./sec at the maximum may be taken into consideration. Thus, if a rate of A/D conversion is 2K samples/sec, a temperature change per A/D conversion period, that is, an expected maximum change amount of temperature detection data between a certain output timing and the next output timing is 0.14 m° C./sample.

Here, if a temperature range taken into consideration in the circuit device is 125° C. (for example, −40° C. to 85° C.), and the number of bits p in A/D conversion is 15, a temperature change per LSB is $125/2^{15} \cong 4$ m° C./LSB. In other words, as can be seen from comparison between 0.14 m° C./sample and 4 m° C./LSB, it is sufficient to assume a temperature change corresponding to whether or not a value of 1LSB changes while A/D conversion result data is output for thirty times under the natural condition.

In other words, in a normal state, an actual temperature change between adjacent output timings is smaller than about 1LSB. The normal state here indicates a state in which a circuit device continuously operates by using set parameters (circuit constant setting information) under the natural condition. Thus, even if a change in temperature detection data at the previous output timing is minimized, a difference between a temperature detection voltage (VTD) and the temperature detection data (DTD) may be considered not to occur, and appropriate A/D conversion can be performed. In the present embodiment, a period in which operation is performed in the normal state is set as a normal operation period.

A change in a value is restricted to k×LSB or less, and thus it is possible to perform A/D conversion efficiently (at a high speed). In typical p-bit A/D conversion, all values of $2^p$ become candidates at each output timing, and thus conversion is required to be performed so that all of the values of $2^p$ can be output. For example, in general successive comparison type A/D conversion, a value of each bit of p bits is determined one by one, and thus p comparison processes are required to be performed. In relation to this fact, in the technique of the present embodiment, only a value (change of 0) which does not change, and values of ±1LSB, ±2LSB, . . . , and ±k×LSB with respect to the temperature detection data DTD at the previous output timing may be used as candidates. Particularly, if k=1, only three values including a change of 0 and ±1LSB may be taken into consideration as candidates, and thus it is possible to simplify processing required in A/D conversion. Specifically, it is possible to reduce the number of comparison processes in a comparison circuit 27, or the number of analog signal generation processes (D/A conversion processes) used for the comparison processes.

1.3 Overview of Second A/D Conversion Method (Second Mode or High Speed Mode)

However, in an actual circuit device, there may be a case where a difference between a temperature detection voltage (VTD) and temperature detection data (DTD) occurs. For example, in the DTCXO, parameters (frequency correction table in FIG. 9) for a temperature compensation process in a digital signal processing circuit 50 is required to be set during manufacturing. In setting of the frequency correction table, measurement is performed at a plurality of different temperatures as will be described later by using flowcharts of FIGS. 17 to 19.

During manufacturing, an ambient temperature (environmental temperature) of a circuit device is changed by using a test device such as a thermostatic tank, and thus a temperature changes more rapidly than under the natural condition. In other words, since the temperature detection voltage VTD from a temperature sensor 10 rapidly changes (specifically, more rapidly changes than a voltage value corresponding to k×LSB), and, thus, in the first mode, the temperature detection data DTD which is output digital data cannot track the change.

Figure 4:
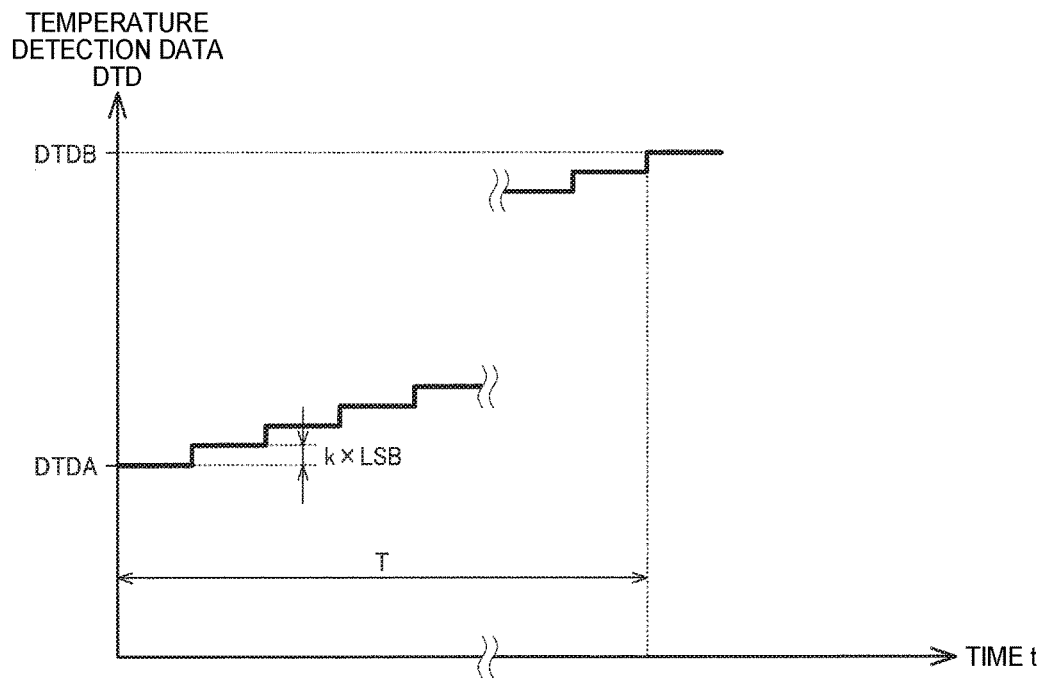
FIG. 4 is a diagram for explaining a problem occurring due to update to k×LSB or less.

FIG. 4 illustrates a temporal change example of the temperature detection data DTD in this case. In FIG. 4, a longitudinal axis expresses the temperature detection data DTD, and a transverse axis expresses time. DTDA indicates an initial value of the temperature detection data DTD, and DTDB indicates a digital value corresponding to an actual temperature. In the first mode, a change with respect to the previous output is restricted to k×LSB or less. Thus, as illustrated in FIG. 4, even if a difference between DTDA and DTDB is great, the temperature detection data DTD changes stepwise by only k×LSB. As a result, it takes a long time for the temperature detection data DTD to track the actual temperature. Specifically, there is concern that time T required for stabilization may be 10 seconds or more in the worst case regardless of setting of an initial value or a length of an A/D conversion period. Particularly, a plurality of measurements are required to create the frequency correction table while changing temperatures, and thus long measurement waiting time occurs for a plurality of number of times.

The parameters set during manufacturing include a reference current or a reference voltage. Since the reference voltage is a voltage for determining a full-scale voltage in A/D conversion, if the reference voltage or the like is changed, the temperature detection data DTD corresponding to the temperature detection voltage VTD changes, and thus there is a probability that there may be a difference therebetween. As will be described later with reference to FIGS. 17 to 19, for example, the parameters are adjusted such that an output from an oscillation circuit 150 is a desired value (26 MHz), but the accuracy of about 10 ppb is necessary as the measurement accuracy of an oscillation frequency.

Figure 5:
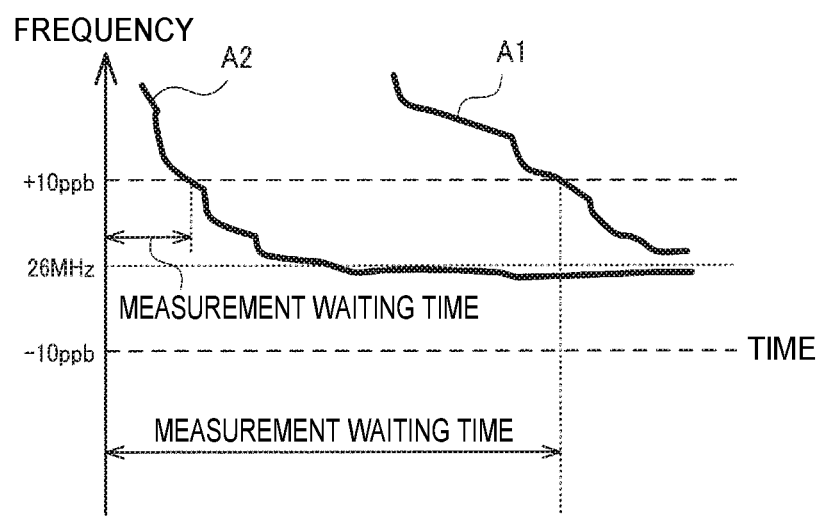
FIG. 5 is another diagram for explaining a problem occurring due to update to k×LSB or less.

As indicated by A1 in FIG. 5, in a case where an operation is performed in the first mode, a long time (for example, Tin FIG. 4) is required to remove a difference between the temperature detection voltage VTD and the temperature detection data DTD due to changes of the parameters, and a waiting time is also required until an oscillation frequency is stabilized. As a result, in order to secure the measurement accuracy of ±10 ppm, a long measurement waiting time is required to be provided to some extent.

There is also a problem when a circuit device is activated. For example, when the circuit device is activated or the like, the previous temperature detection data DTD is not acquired. Thus, as an initial value, a certain value, for example, an intermediate value such as "100000000000000" of 15 bits is set, and the initial value has no relation to an actual temperature. In other words, a difference between the temperature detection voltage VTD and the temperature detection data DTD is great in a period (activation period) required to output the initial temperature detection data DTD, and, in the first mode, it takes time for an oscillation frequency to be stabilized to an appropriate value.

In light of the above-described fact, an A/D conversion circuit 20 of the present embodiment operates in the first mode in which an A/D conversion process is performed according to the first A/D conversion method such that temperature detection data is obtained, and switches to the second mode in which an A/D conversion process is performed according to a second A/D conversion method which is different from the first A/D conversion method such that temperature detection data is obtained if a predetermined condition is established. In a narrow sense, the A/D conversion circuit 20 operates in the first mode in the normal operation period, and switches to the second mode if a predetermined condition is established. The predetermined condition here may be various conditions in which digital access has been performed via an interface, a switching command has been input, a predetermined temperature change has been detected, and the like. Details of switching of an A/D conversion method (mode) will be described later.

In the second mode, the temperature detection data DTD corresponding to the temperature detection voltage VTD can be output in a short period of time, and various techniques are applicable. For example, the second A/D conversion method may employ various types of A/D conversion such as well-known successive comparison type, $\Delta\Sigma$ type, or flash type A/D conversion. In general A/D conversion, since all bits are processed at each output timing, ideally, a difference between the temperature detection voltage VTD and the temperature detection data DTD can be removed by using a single output.

In the above-described way, the measurement waiting time can be reduced, and thus it is possible to reduce a manufacturing time of a circuit device or manufacturing cost. The second mode is the same as the first mode in that a waiting time is required until an oscillation frequency is stabilized after the temperature detection data DTD is output, but, as indicated by A2 in FIG. 5, a total measurement waiting time can be considerably reduced.

However, there is also a request for further increasing (reducing an A/D conversion period) a rate of A/D conversion. This is because, if temperature detection data can be acquired at a high speed, there is a considerable advantage in a process or the like using the temperature detection data. In the example of manufacturing, each measurement waiting time can be further reduced.

A circuit device can be activated at a high speed by further increasing a rate of A/D conversion. For example, in a case where the DTCXO is used for communication of a mobile phone, an output frequency is required to be stabilized within 2 msec from activation. For this, the temperature detection data DTD for temperature compensation has to be set to a highly accurate value in the time shorter than 2 msec at longest, and thus it is necessary to perform A/D conversion at a high speed.

The $\Delta\Sigma$ type A/D conversion uses an integral circuit, and thus high speed output is difficult. The flash type A/D conversion realizes high speed, but as the number of bits increases, a circuit scale also increases, and thus the flash type A/D conversion is not proper for A/D conversion, for example, in a case where 10 bits are exceeded. In the successive comparison type conversion, since comparison processes corresponding to the number of times corresponding to the number of bits are required to be performed, for example, if 15 comparison processes are performed at 2K samples/sec, 7.5 msec is required until an output is obtained, and thus the above-described request for 2 msec is not satisfied.

In a case of the successive comparison type conversion, time required for a comparison process per bit is reduced, and thus it is possible to reduce time required to obtain an output. However, it is known that, if time for a comparison process is reduced, determination accuracy is lowered. In an example of a comparison circuit 27 using a chopper circuit which will be described later with reference to FIG. 10, since each of a sample mode and a comparator mode is reduced, a result of a comparison process is output before a circuit state is stabilized, and thus accuracy is lowered.

On the basis of the above description, in the present embodiment, an A/D conversion method (second A/D conversion method) which achieves both speed and accuracy is used.

Figure 6:
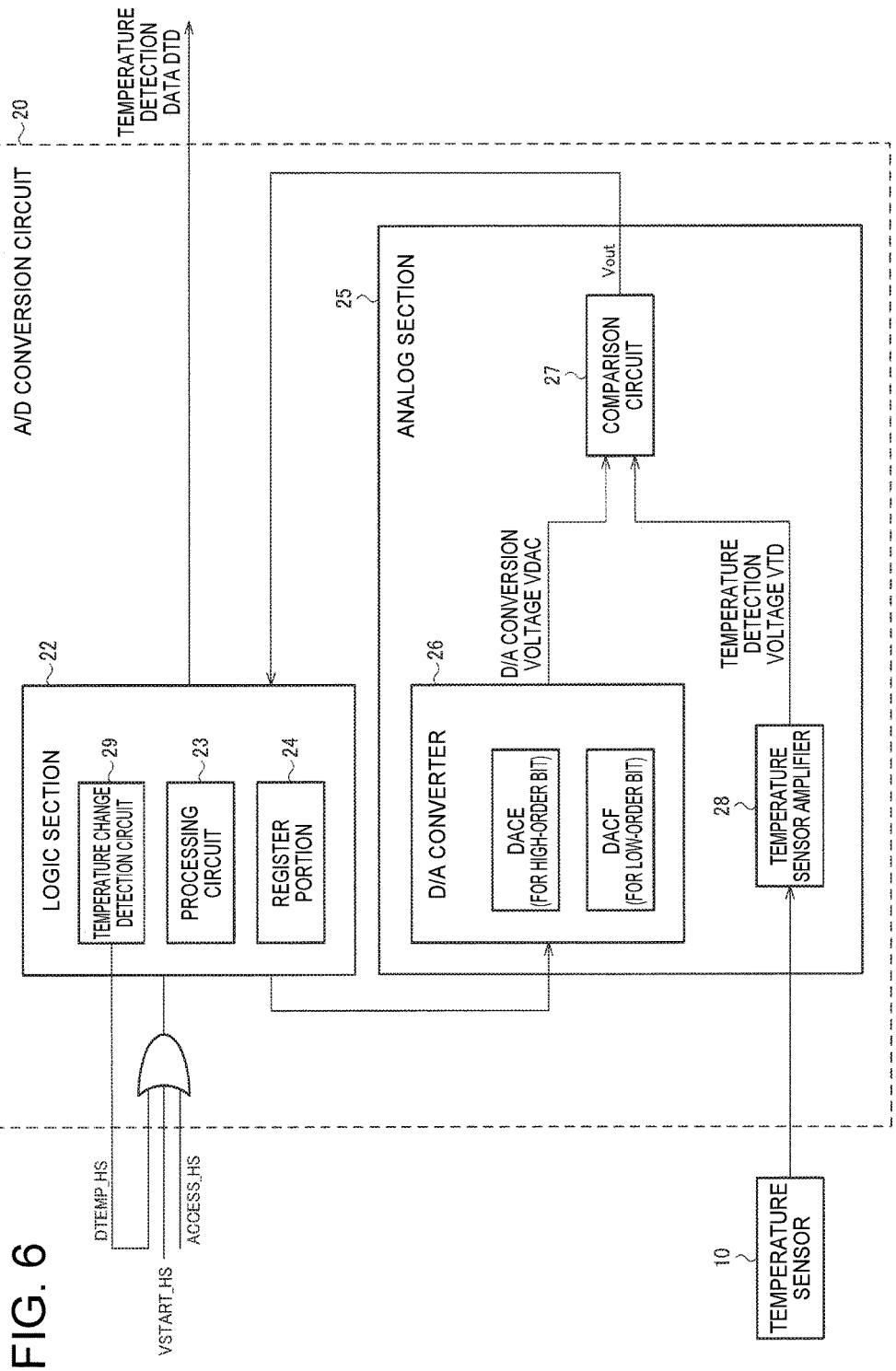
FIG. 6 illustrates a configuration example of an A/D conversion circuit.

Specifically, the A/D conversion circuit 20 according to the present embodiment may include, as illustrated in FIG. 6, a register portion 24 which stores result data, for example, intermediate result data or final result data; a D/A converter 26 which D/A-converts the result data so as to output a D/A conversion voltage; a comparison circuit 27 which compares the temperature detection voltage VTD from the temperature sensor 10 with the D/A conversion voltage VDAC from the D/A converter 26; and a processing circuit 23 which performs a determination process on the basis of a comparison result in the comparison circuit 27, and performs a process of updating the result data on the basis of the determination process, so as to obtain A/D conversion result data of an input voltage. The processing circuit 23 outputs the final result data which is an update process result as the temperature detection data DTD.

The second A/D conversion method is a process in which a determination process on result data on a most significant bit (MSB) side is performed in a first determination period, and a determination process on A/D conversion result data on a least significant bit (LSB) side is performed in a second determination period longer than the first determination period.

Here, the intermediate result data and the final result data are digital data stored in the register portion 24. The final result data corresponds to a single A/D conversion result (the temperature detection data DTD), and the intermediate result data is data obtained in the middle of obtaining the final result data. In a case of the normal operation mode, data obtained by subtracting (adding) 1LSB from (to) the previous final result data corresponds to intermediate result data, and data obtained through a determination process corresponds to final result data. In the high speed mode, data with accuracy corresponding to the number of bits (for example, 15 bits) in A/D conversion corresponds to final result data, and intermediate data (for example, data of which only the number of bits on the MSB side is determined) in a process of obtaining the data with 15-bit accuracy corresponds to intermediate result data.

The "MSB side" and the "LSB side" may be variously defined, but, the MSB side may be a bit range of a single bit or a plurality of bits closer to a most significant bit (MSB), and the LSB side may be a bit range of a single bit or a plurality of bits closer to a least significant bit (LSB) than the MSB side. In a narrow sense, the MSB side is a single bit or a plurality of bits including the MSB, and the LSB side is a single bit or a plurality of bits including the LSB.

Data on the MSB side indicates a great value, and thus a difference between an analog signal (voltage value) corresponding to a case where a bit is 0 and an analog signal corresponding to a case where a bit is 1 is relatively great. Conversely, data on the LSB side indicates a small value, and thus a difference between an analog signal corresponding to a case where a bit is 0 and an analog signal corresponding to a case where a bit is 1 is relatively small.

In other words, a probability of determination errors can be reduced even if a rough comparison process is performed in the MSB side compared with the LSB side. A period of a determination process on the MSB side is relatively shortened by taking into consideration this fact, and thus it is possible to reduce time required for A/D conversion performed once. There may be various specific numerical examples, and, in an example which will be described later with reference to FIGS. 12 and 13, A/D conversion result data can be output in the required time of about 1.5 msec.

In order to further improve the accuracy of A/D conversion, a technique of updating (correcting) a determination result of the MSB side on the basis of a determination result of the LSB side. In the present embodiment, a determination period for the LSB side is relatively long, and thus the determination accuracy is expected to be also increased. In other words, a determination result whose accuracy is relatively low is corrected on the basis of a determination result of whose accuracy is high, and thus it is possible to increase the accuracy of the entire A/D conversion. A specific technique will be described later.

Figure 7:
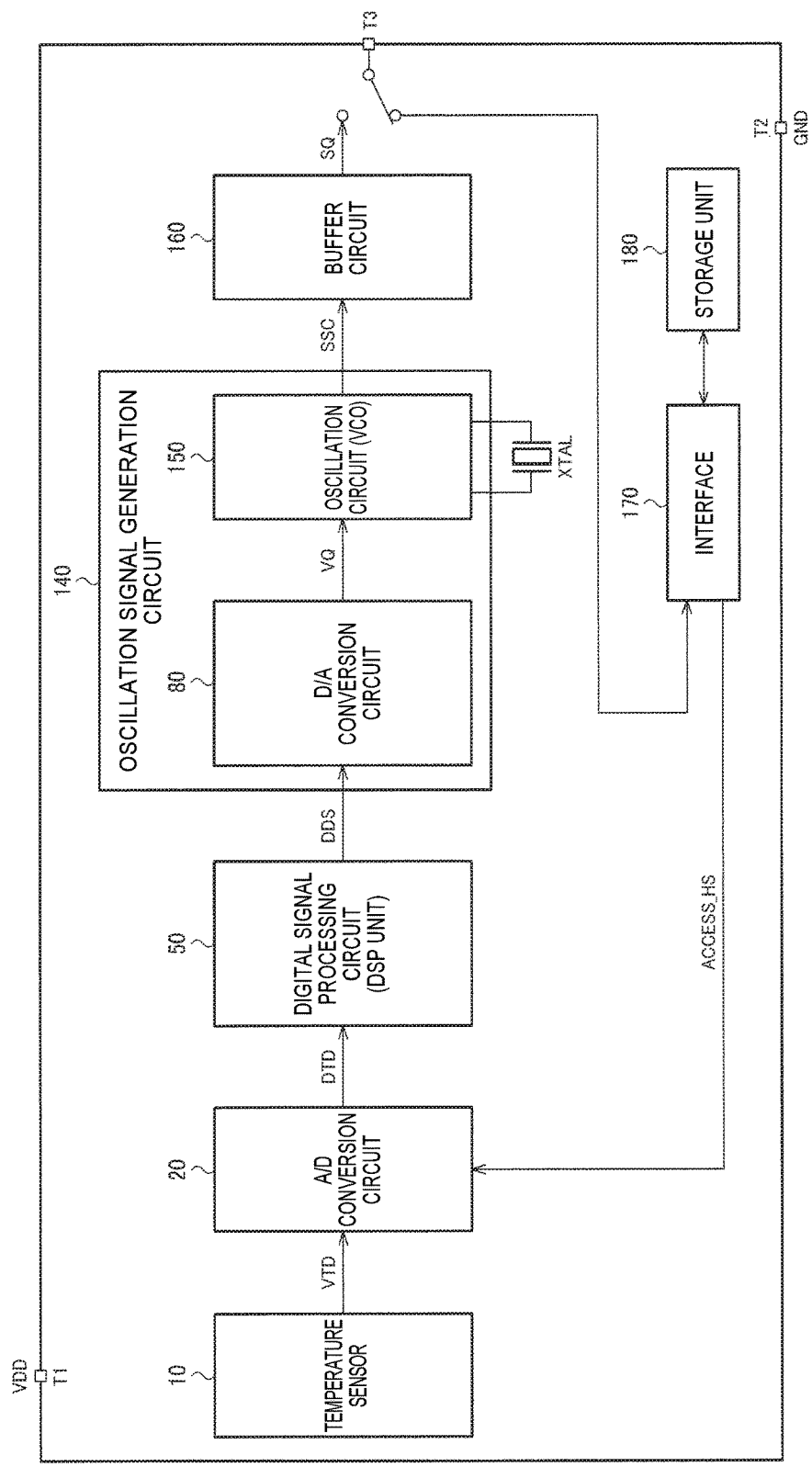
FIG. 7 illustrates a configuration example of a circuit device.

Hereinafter, the present embodiment will be described in detail. First, a configuration example of the circuit device according to the present embodiment will be described. As illustrated in FIG. 7 or the like, a configuration example of a circuit device used in a digital type oscillator such as a DTCXO will be described, but a circuit device according to the present embodiment is not limited thereto. Then, each unit in FIG. 7 will be described in detail. Specifically, the first mode and the second mode in the A/D conversion circuit 20 will be described, and various conditions for switching between the modes will also be described. In the following description, the first mode will be referred to as the normal operation mode, and the second mode will be referred to as the high speed mode (HS mode). Thereafter, a description will be made of several modification examples will be described, and examples of an electronic apparatus and the like including the circuit device of the present embodiment.

2. Configuration

FIG. 7 illustrates a configuration example of the circuit device of the present embodiment. The circuit device is a circuit device (semiconductor chip) implementing a digital type oscillator such as a DTCXO or an OCXO. For example, the circuit device and a resonator XTAL are stored in a package, and thus the digital type oscillator is implemented.

The circuit device includes the A/D conversion circuit 20, the digital signal processing circuit 50, an oscillation signal generation circuit 140, an interface (interface unit) 170, and a storage unit (a memory or a storage) 180. The circuit device may include terminals T1 to T3. The terminal T1 is a terminal is a terminal to which a first reference voltage VDD. The second terminal T2 is a terminal to which a second reference voltage GND (the ground in a narrow sense). The third terminal T3 is a terminal used to output an oscillation signal, or to input a command code, address information, or circuit constant setting information via the interface 170.

The circuit device may include the temperature sensor 10 (temperature sensor unit) and a buffer circuit 160. A configuration of the circuit device is not limited to the configuration illustrated in FIG. 7, and may be variously modified by omitting some constituent elements (for example, the temperature sensor and the buffer circuit) or adding other constituent elements thereto.

The resonator XTAL is, for example, a piezoelectric resonator such as a quartz crystal resonator. The resonator XTAL may be an oven type oscillator (OCXO) provided in a thermostatic tank. The resonator XTAL may be a resonator (an electromechanical resonator or an electrical resonance circuit). As the resonator XTAL, a piezoelectric resonator, a surface acoustic wave (SAW) resonator, a microelectromechanical system (MEMS) resonator, and the like may be used. As a substrate material of the resonator XTAL, a piezoelectric single crystal of quartz crystal, lithium tantalate, or lithium niobate, a piezoelectric material such as piezoelectric ceramics of lead zirconate titanate or the like, or a silicon semiconductor material may be used. The resonator XTAL may be excited due to a piezoelectric effect, and may be excited by using electrostatic driving based on a Coulomb force.

The temperature sensor 10 outputs the temperature detection voltage VTD. Specifically, a temperature-dependent voltage which changes according to the temperature of the environment (circuit device) is output as the temperature detection voltage VTD.

The A/D conversion circuit 20 performs A/D conversion on the temperature detection voltage VTD from the temperature sensor 10 so as to output the temperature detection data DTD. As an A/D conversion method of the A/D conversion circuit 20, as described above, the normal operation mode and the high speed mode may be used in a switching manner, and details thereof will be described later.

The digital signal processing circuit 50 (DSP unit) performs various signal processes. For example, the digital signal processing circuit 50 (temperature compensation unit) performs a temperature compensation process on an oscillation frequency (a frequency of an oscillation signal which is an output from the oscillation signal generation circuit 140) on the basis of the temperature detection data DTD. Frequency control data DDS of the oscillation frequency is output. Specifically, the digital signal processing circuit 50 performs a temperature compensation process for making the oscillation frequency constant on the basis of the temperature detection data DTD (temperature-dependent data) which changes according to a temperature, coefficient data (data regarding coefficients of an approximate function) for temperature compensation processing, even in a case where a temperature changes. The digital signal processing circuit 50 may be implemented by an ASIC circuit such as gate arrays, and may be implemented by a processor and a program executed on the processor.

The oscillation signal generation circuit 140 generates an oscillation signal SSC. For example, the oscillation signal generation circuit 140 generates the oscillation signal SSC with an oscillation frequency which is set on the basis of the frequency control data DDS, by using the frequency control data DDS from the digital signal processing circuit 50, and the resonator XTAL. As an example, the oscillation signal generation circuit 140 causes the resonator XTAL to oscillate at an oscillation frequency which is set on the basis of the frequency control data DDS, so as to generate the oscillation signal SSC.

The oscillation signal generation circuit 140 may be a circuit which generates the oscillation signal SSC according to a direct digital synthesizer method. For example, the oscillation signal SSC with an oscillation frequency set on the basis of the frequency control data DDS may be digitally generated by using an oscillation signal of the resonator XTAL (an oscillation source for a fixed oscillation frequency) as a reference signal.

The oscillation signal generation circuit 140 may include a D/A conversion circuit 80 and an oscillation circuit 150. However, a configuration of the oscillation signal generation circuit 140 is not limited to such a configuration, and may be variously modified by omitting some constituent elements or adding other constituent elements thereto.

The D/A conversion circuit 80 performs D/A conversion on the frequency control data DDS (output data from the processing unit) from the digital signal processing circuit 50. The frequency control data DDS which is input to the D/A conversion circuit 80 is frequency control data (frequency control code) obtained after the temperature compensation process is performed by the digital signal processing circuit 50. As a D/A conversion type of the D/A conversion unit 80, a resistance string type (resistance division type) may be employed. However, a D/A conversion type is not limited thereto, and various types such as a resistance ladder type (R-2R ladder type or the like), a capacitor array type, and a pulse width modulation type may be employed. The D/A conversion circuit 80 may include not only a D/A converter but also a control circuit, a modulation circuit, a filter circuit, or the like.

The oscillation circuit 150 generates the oscillation signal SSC by using an output voltage VQ from the D/A conversion unit 80, and the resonator XTAL. The oscillation circuit 150 is connected to the resonator XTAL via first and second resonator terminals (resonator pads). For example, the oscillation circuit 150 causes the resonator XTAL (a piezoelectric resonator, a resonator, or the like) to oscillate so as to generate the oscillation signal SSC. Specifically, the oscillation circuit 150 causes the resonator XTAL to oscillate at an oscillation frequency at which the output voltage VQ of the D/A conversion circuit 80 is used as a frequency control voltage (oscillation control voltage). For example, in a case where the oscillation circuit 150 is a circuit (VCO) which controls oscillation of the resonator XTAL through voltage control, the oscillation circuit 150 may include a variable capacitance capacitor (varicap or the like) whose capacitance value varies depending on a frequency control voltage.

As described above, the oscillation circuit 150 may be implemented by a direct digital synthesizer type circuit, and, in this case, an oscillation frequency of the resonator XTAL is used as a reference frequency and is different from an oscillation frequency of the oscillation signal SSC.

The buffer circuit 160 buffers the oscillation signal SSC generated by the oscillation signal generation circuit 140 (oscillation circuit 150), and outputs a buffered signal SQ. In other words, buffering for sufficiently driving an external load is performed. The signal SQ is, for example, a clipped sine wave signal. However, the signal SQ may be a rectangular wave signal. Alternatively, the buffer circuit 160 may be a circuit which can output both of a clipped sine wave signal and a rectangular wave signal as the signal SQ.

The interface (interface unit) 170 is an interface used for digital access to the circuit device, and may be implemented by various types of circuits such as a serial peripheral interface (SPI) or an inter-integrated circuit (I2C).

The storage unit 180 stores various pieces of information used for the circuit device, and a function thereof may be realized by a memory (nonvolatile memory) such as a flash memory. However, the storage unit 180 may include a static random access memory (SRAM), a dynamic random access memory (DRAM), and a read only memory (ROM). The storage unit 180 may be implemented by a storage such as a hard disk drive (HDD). The storage unit 180 stores circuit constant setting information or a frequency correction table (coefficient data) which will be described later.

In FIG. 7, some connection relationships are not illustrated in order to clarify the drawing, but the interface 170 or the storage unit 180 may be connected to each block of the circuit device.

Figure 8:
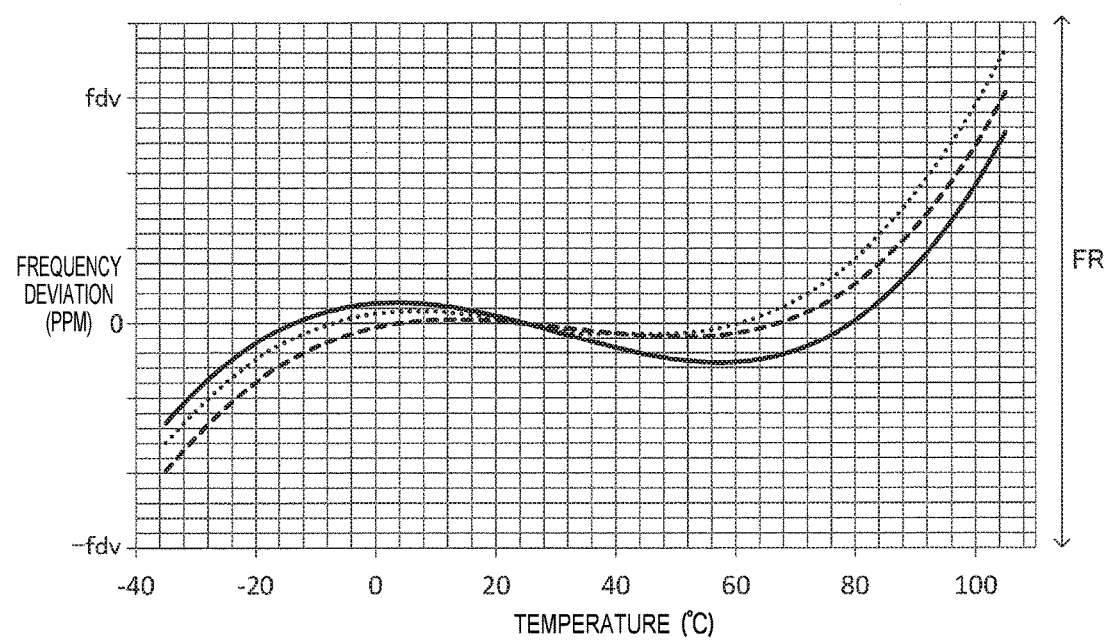
FIG. 8 is a diagram illustrating an example of temperature characteristics of a resonator or variations therein.

FIG. 8 is a diagram illustrating an example of frequency deviation of an oscillation frequency due to the temperature of the resonator XTAL (AT resonator or the like). The digital signal processing circuit 50 performs a temperature compensation process for making an oscillation frequency of the resonator XTAL having temperature characteristics as illustrated in FIG. 8 constant regardless of a temperature.

Figure 9:
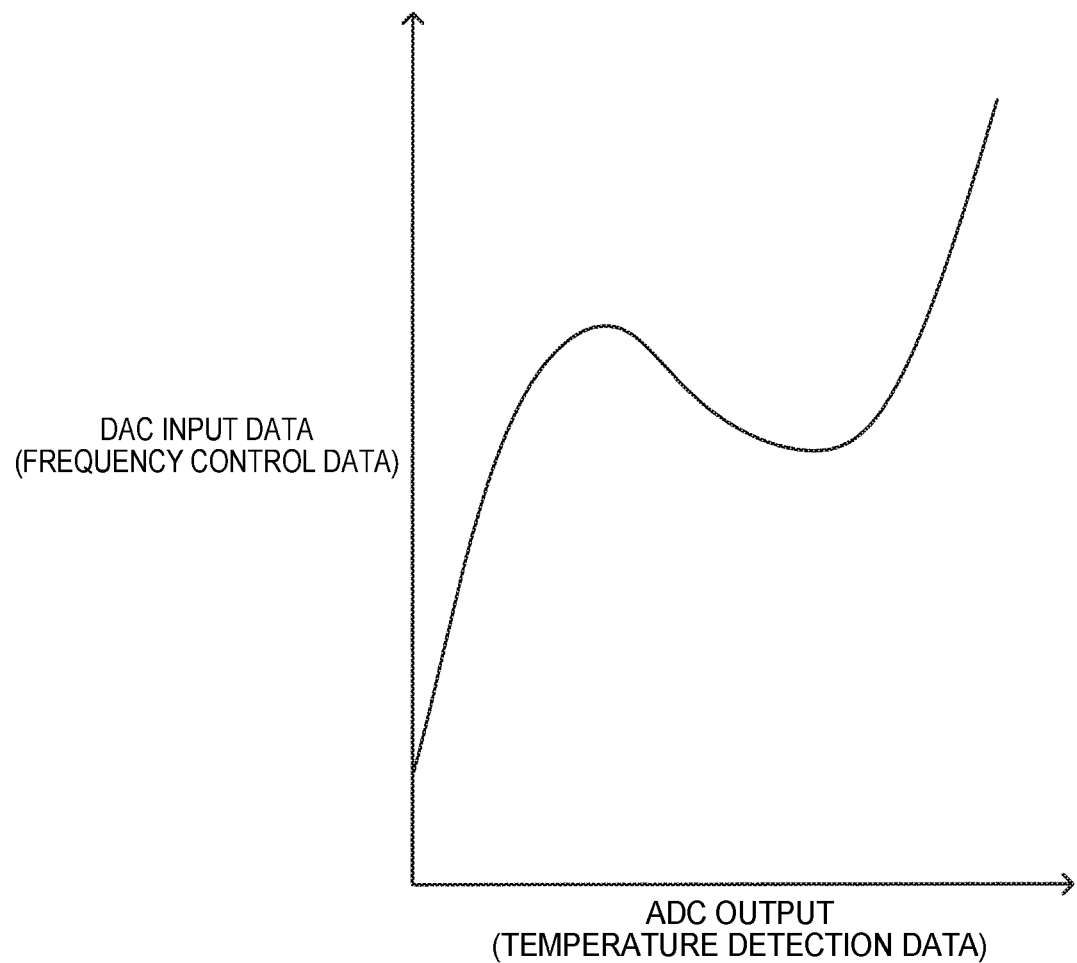
FIG. 9 is a diagram for explaining a temperature compensation process.

Specifically, the digital signal processing circuit 50 performs a temperature compensation process so that output data (temperature detection data DTD) of the A/D conversion circuit 20 and input data (frequency control data) of the D/A conversion circuit 80 have a correspondence relationship as illustrated in FIG. 9. The correspondence relationship (frequency correction table) illustrated in FIG. 9 may be acquired according to a technique (a manufacturing step or a test step) which will be described later with reference to FIGS. 17 to 19.

Coefficient data of an approximate function used for temperature compensation for realizing the correspondence relationship illustrated in FIG. 9 is stored in the storage unit 180 (nonvolatile memory) of the circuit device. The digital signal processing circuit 50 performs a calculation process on the basis of the coefficient data read from the storage unit 180 and the temperature detection data DTD from the A/D conversion circuit 20, and thus realizes a temperature compensation process for making an oscillation frequency of the resonator XTAL constant regardless of a temperature.

The temperature detection voltage VTD from the temperature sensor 10 has, for example, negative temperature characteristics as will be described later. Therefore, temperature dependency of an oscillation frequency of the resonator XTAL illustrated in FIG. 8 can be compensated for as a result of being canceled out by using the temperature compensation characteristics as illustrated in FIG. 9.

3. A/D Conversion Circuit

Next, the A/D conversion circuit 20 will be described in detail. Specifically, a configuration example of the A/D conversion circuit 20 will be described, and then each of the normal operation mode and the high speed mode will be described. A description will be further made of a specific example of mode switching.

3.1 Configuration Example

A configuration example of the A/D conversion circuit 20 is the same as illustrated in FIG. 6. As illustrated in FIG. 6, the A/D conversion circuit 20 includes the processing circuit 23, the register portion 24, the D/A converter 26 (a DACE and a DACF), the comparison circuit 27, and a temperature change detection circuit 29. The A/D conversion circuit 20 may include a temperature sensor amplifier 28. The processing circuit 23, the register portion 24, and the temperature change detection circuit 29 are provided as a logic section 22, and the D/A converter 26, the comparison circuit 27, and the temperature sensor amplifier 28 are provided as an analog section 25.

The register portion 24 stores result data such as intermediate result data or final result data in A/D conversion. The register portion 24 corresponds to, for example, a successive comparison result register in a successive comparison method. The D/A converter 26 (the DACE and the DACF) performs D/A conversion on the result data from the register portion 24. Various well-known D/A converters may be employed as the DACE or the DACF. The comparison circuit 27 compares an output voltage (D/A conversion voltage VDAC) from the D/A converter 26 with the temperature detection voltage VTD (a voltage amplified by the temperature sensor amplifier 28; an input voltage in a broad sense). The comparison circuit 27 may be implemented by, for example, a chopper type comparator.

The processing circuit 23 performs a determination process on the basis of a comparison result in the comparison circuit 27, so as to perform a process of updating the result data in the register portion 24. The final temperature detection data DTD obtained through the update process is output from the A/D conversion circuit 20 as a result of A/D conversion of the temperature detection voltage VTD. With this configuration, A/D conversion can be realized according to the normal operation mode, the high speed mode, or a general successive comparison method.

The D/A converter 26 performs D/A conversion on the result data having undergone the update process in the processing circuit 23. Consequently, the result data having undergone the update process can be used as a comparison target with the temperature detection voltage VTD in the next comparison process.

Figure 10:
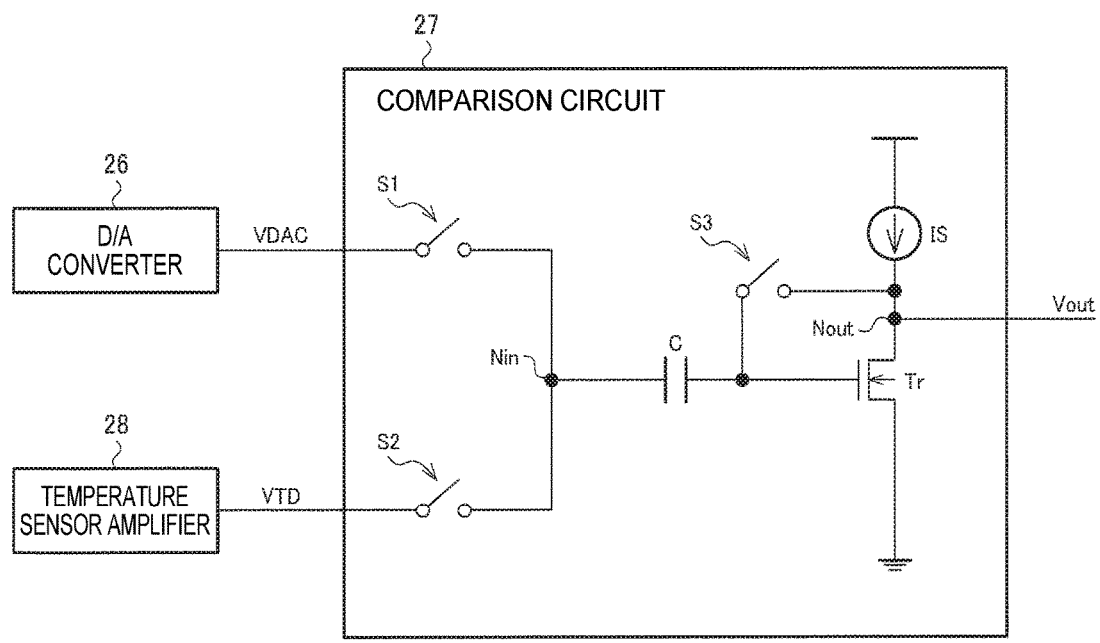
FIG. 10 illustrates a configuration example of a comparison circuit.

FIG. 10 illustrates a configuration example of the comparison circuit 27. The comparison circuit 27 includes a first switch S1 to which a D/A conversion voltage which is a result of the result data in the register portion 24 being D/A-converted by the D/A converter 26 is input; a second switch S2 to which the temperature detection voltage VTD is input; a capacitor C whose one end (input terminal Nin) is connected to the switches S1 and S2; a transistor Tr whose gate terminal is connected to the other end of the capacitor C; a third switch S3 provided between the gate terminal and a drain terminal of the transistor Tr; and a current source IS provided between the drain terminal of the transistor Tr and a high potential side power source terminal. A source terminal of the transistor Tr is connected to a low potential side power source terminal (ground). An output terminal Nout is connected to the drain terminal of the transistor Tr, and an output voltage Vout is output from the output terminal Nout.

The comparison circuit 27 has two modes such as a sample mode and a comparator mode. In the sample mode, the temperature detection voltage VTD is sampled, and, in the comparator mode, the temperature detection voltage VTD is compared with the D/A conversion voltage VDAC. In the example illustrated in FIG. 7, in the sample mode, the switch S1 is set to be turned off, and the switches S2 and S3 are set to be turned on. In the comparator mode, the switch S1 is set to be turned on, and the switches S2 and S3 are set to be turned off.

Here, in a case where the temperature detection voltage VTD is higher than the D/A conversion voltage VDAC, up determination is performed, and, in a case where the temperature detection voltage VTD is lower than the D/A conversion voltage VDAC, down determination is performed.

The processing circuit 23 may determine a value of the output temperature detection data DTD according to a result of the up determination or the down determination. A specific digital value used for generation of the D/A conversion voltage VDAC or a specific technique of determining the temperature detection data DTD will be described later with respect to each of the normal operation mode and the high speed mode.

An OR circuit outputs a mode switching signal. Specifically, the OR circuit outputs a logical sum of a switching signal (ACCESS_HS) from the interface 170, a signal (VSTART_HS) from a circuit (in a narrow sense, a power-on reset circuit) which operates during activation, and a signal (DTEMP_HS) from the temperature change detection circuit 29. The signal ACCESS_HS is a signal which becomes active (H level) on the basis of digital access. The signal VSTART_HS is a signal which is brought into an H level during activation. The signal DTEMP_HS is a signal which is brought into an H level in a case where a temperature change of a predetermined level or higher is detected. Specifically, each of the signals ACCESS_HS, VSTART_HS and DTEMP_HS is a signal for giving an instruction for switching to the high speed mode, and, in a case where at least one thereof becomes active, an output from the OR circuit also becomes active, and thus the A/D conversion circuit 20 transitions to the high speed mode.

3.2 Normal Operation Mode

Figure 11:
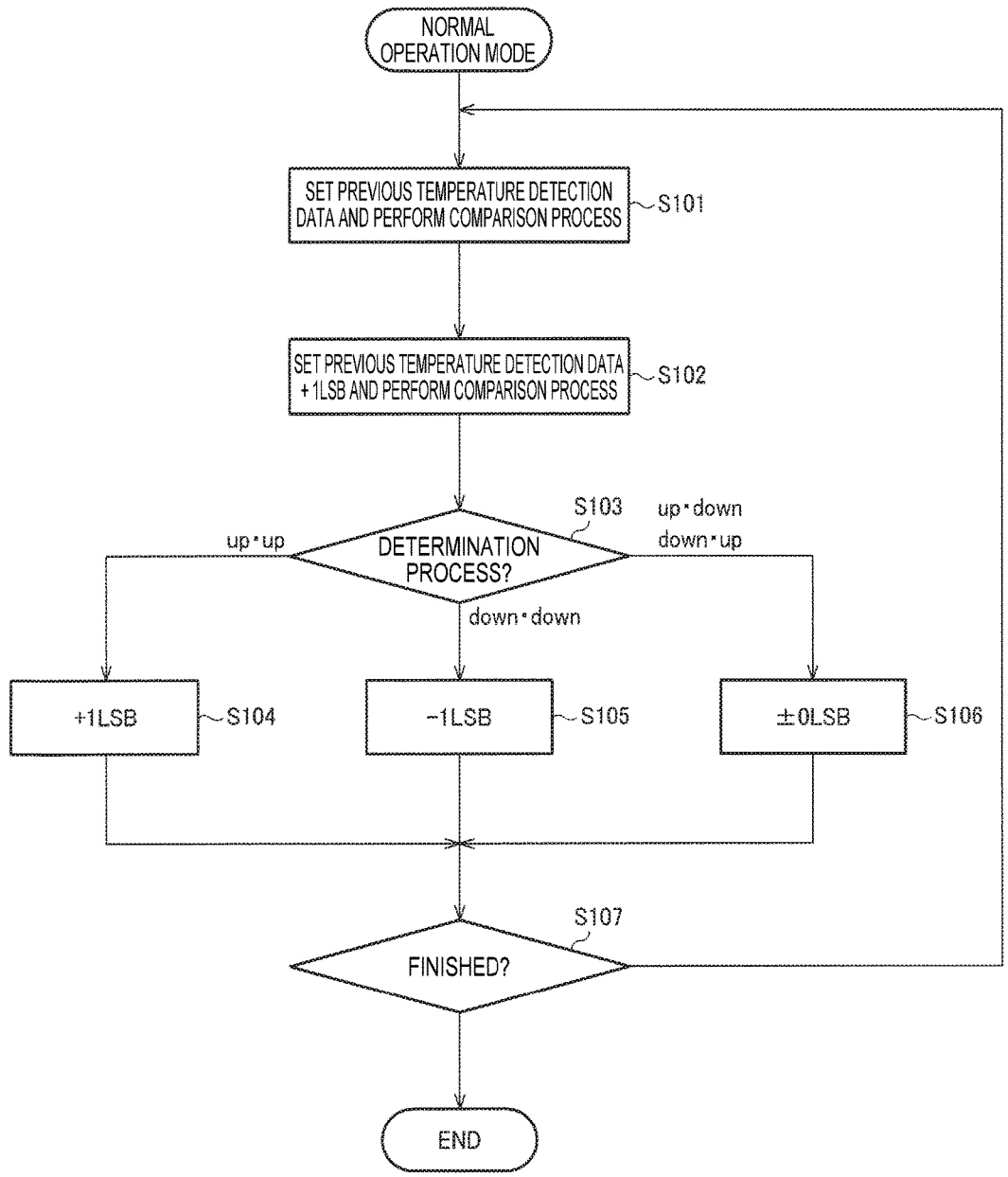
FIG. 11 is a flowchart for explaining a process in a normal operation mode.

FIG. 11 is a flowchart for explaining a process in the normal operation mode. Here, first, the description will be made by exemplifying a case of k=1. If the normal operation mode is started, first, a code of the previous temperature detection data DTD is D/A-converted by the D/A converter 26 so as to be used as the D/A conversion voltage VDAC (step S101). A comparison process with the temperature detection voltage VTD is performed in the sample mode and the comparator mode, and a result of an up determination or a down determination is acquired.

Next, 1LSB is added to a value in the register portion 24, that is, a value of the previous temperature detection data DTD, and D/A conversion is performed on data as a result of the addition in the D/A converter 26, and an obtained result is used as the D/A conversion voltage VDAC (step S102). A comparison process with the temperature detection voltage VTD is performed in the sample mode and the comparator mode, and a result of an up determination or a down determination is acquired.

Through steps S101 and S102, the comparison circuit 27 outputs a first comparison result which is a comparison result between the D/A conversion voltage VDAC obtained by D/A-converting the temperature detection data DTD (previous final result data) at the previous output timing in the D/A converter 26 and the temperature detection voltage VTD, and outputs a second comparison result which is a comparison result between the D/A conversion voltage VDAC obtained by D/A-converting second data in which 1LSB is added to the previous final result data in the D/A converter 26 and the temperature detection voltage VTD.

The processing circuit 23 performs a determination process of determining the present temperature detection data DTD on the basis of the two comparison process results (step S103). First, in a case where it is determined that the temperature detection voltage VTD is higher than the D/A conversion voltage VDAC according to a determination process based on the first comparison result, that is, in a case where an up determination is performed, and a result of a determination process based on the second comparison result is also an up determination, the present final result data is determined to be a value obtained by adding 1LSB to the second data, that is, the previous temperature detection data DTD (step S104).

In a case where it is determined that the temperature detection voltage VTD is lower than the D/A conversion voltage VDAC according to a determination process based on the first comparison result, that is, in a case where a down determination is performed, and a result of a determination process based on the second comparison result is also a down determination, the present final result data is determined to be a value obtained by subtracting 1LSB from the previous final result data (step S105).

The case where both of the two comparison processes are an up (down) determination corresponds to a state in which the present temperature is sufficiently higher (lower) than a temperature at the previous output timing. Thus, the present temperature detection data DTD may be larger (smaller) than the previous temperature detection data DTD, and, here, since a change width is 1LSB or less, and thus a value obtained by adding (subtracting) only 1LSB may be output.

A case where a result of a determination process based on the first comparison result is an up determination, and a result of a determination process based on the second comparison result is a down determination corresponds to a state in which a temperature change is not great. Thus, the present temperature detection data DTD is maintained to have a value of the previous temperature detection data DTD (step S106).

A case where a result of a determination process based on the first comparison result is a down determination, and a result of a determination process based on the second comparison result is an up determination corresponds to a state which does not normally occur. Since there is a concern that at least one of the first and second comparison processes may not be appropriately performed in this state, it is not preferable to change a value of the temperature detection data DTD which is output through such an inappropriate determination. Therefore, in the present embodiment, in a case where a result of a determination process based on the first comparison result is a down determination, and a result of a determination process based on the second comparison result is an up determination, the present temperature detection data DTD is maintained to have a value of the previous temperature detection data DTD (step S106).

Two comparison processes are performed since k=1 here, but, processing can also be similarly simplified in a case where k is 2 or greater. In other words, a value of the previous temperature detection data DTD which has already been obtained can be used for bits on the MSB side exceeding ±k×LSB, and thus there is an effect of being capable of omitting a comparison process for determining the bits.

It is determined whether or not the normal operation mode is finished, for example, a disable signal is input (step S107) after any one of steps S104 to S106 is performed, and, in a case where the disable signal is input in step S107, the normal operation mode is finished, and in a case where the disable signal is not input, the flow returns to step S101 so that the process is continuously performed.

3.3 High Speed Mode

Since a bit on the MSB side corresponds to a great value, a value (a voltage value as an analog signal in a case where D/A conversion is performed) greatly changes according to whether the bit is 0 or 1. Thus, a probability of the occurrence of a determination error in a comparison process performed by the comparison circuit 27 is lower on the MSB side than on the LSB side. However, a probability of the occurrence of a determination error still remains, and, in the present embodiment, a determination period for the MSB side is short, and thus a probability of the occurrence of a determination error increases. As described above, the MSB side has high contribution to a value, and thus has considerable influence on the value in a case where a determination error occurs.

In the present embodiment, by taking into consideration this fact, a determination result of the MSB side is corrected on the basis of a determination result of the LSB side. A determination period for the LSB side is relatively long, and thus the determination accuracy can also be increased. In other words, a result of the MSB side whose determination accuracy is relatively low is corrected on the basis of a result of the LSB side whose determination accuracy is high, and thus it is possible to increase the accuracy of the temperature detection data DTD. Therefore, hereinafter, this correction technique will be described as well.

The high speed mode is a technique similar to a successive comparison mode, and allows a value of the temperature detection data DTD to be determined by one bit from the MSB side. However, as will be described later, in a case where correction of a result of the MSB side using a result of the LSB side is performed through carry or borrow from a low-order bit, a possibility of carry and borrow has to be taken into consideration for all bits in the process by one bit, and thus the number of comparison processes increases. For example, in a case where A/D conversion is performed in 15 bits, the presence or absence of carry and borrow has to be determined every time in processes of 14 bits excluding the most significant bit. In this case, even if the time for a single comparison process is shortened, there is a concern that the effect of achieving a high speed may be reduced.

Therefore, in order to efficiently achieve high speed while performing carry or borrow from a low-order bit, it is preferable to reduce the number of determining the occurrence of carry (borrow). For example, in a case where a process is performed with 2 bits as one unit, 15 bits may be partitioned into 8 bit ranges as will be described later, and a determination of carry or borrow may be performed in 7 bit ranges excluding the most significant 2 bits.

Figure 12:
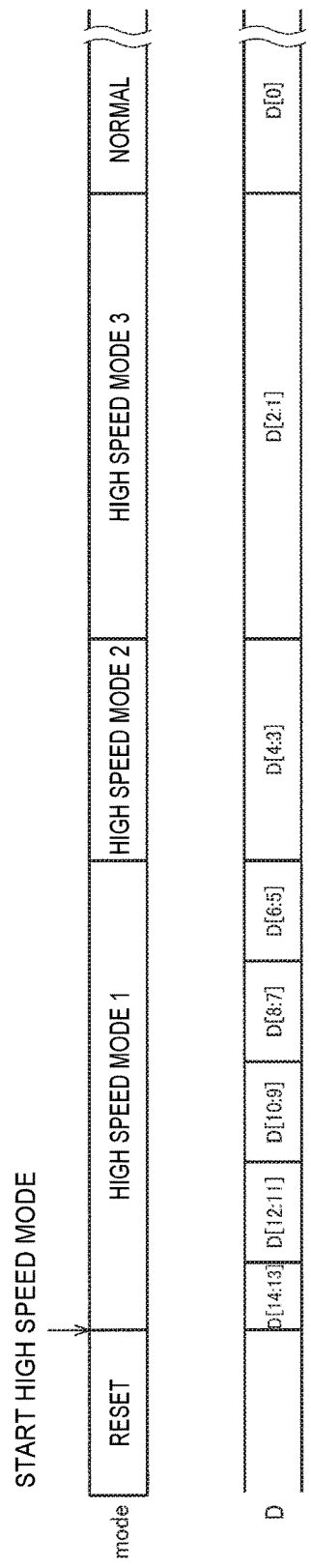
FIG. 12 illustrates an example of setting a determination period in a high speed mode.

Therefore, hereinafter, as an example, a description will be made of a case where A/D conversion result data is partitioned into a plurality of bit ranges with a predetermined bit width, and a bit value is determined from the MSB side to the LSB side in each bit range. Particularly, in an example which will be described later, the predetermined bit width is 2 bits. Of course, the predetermined bit width here may be 3 or more bits, and, as described above, a process may be performed in the 1 bit unit. In FIG. 12 or 13, as can be seen from the fact that the least significant bit has one bit as the unit, all bit ranges do not have to be set with the same bit width, and, for example, there may be a modification example in which different bit widths are set on the MSB side and the LSB side.

3.3.1 Difference Between Determination Periods on MSB Side and LSB Side

FIGS. 12 and 13 illustrate setting examples of determination periods in the high speed mode. A transverse axis in FIG. 12 expresses time. An upper part in FIG. 12 illustrates a mode, and, here, three modes (mode 1 to mode 3) having different determination period lengths are set in the high speed mode. A lower part in FIG. 12 illustrates a determination target bit in A/D conversion result data of 15 bits. D[x:y] indicates data having a width of x−y+1 from a y-th bit to an x-th bit when counted from the least significant bit (LSB) in the A/D conversion result data. Since the least significant bit is D[0], for example, D[14:13] indicates 2 bits on the MSB side.

As can be seen from FIG. 12, five partitions including D[14:13] to D[6:5] are set to the mode 1 in which a determination period is shortest (highest speed). In FIG. 12, determination period lengths are different in D[14:13] and other partitions, and this occurs from the viewpoint that carry and borrow are not taken into consideration in the most significant bit, but there is no difference in the time required for one comparison process.

D[4:3] is set to the mode 2 in which a determination period is longer than the mode 1, and D[2:1] is set to the mode in which a determination period is further longer. A determination period which is longer than that of the mode 3 is set for D[0] which is the least significant bit. As will be described later in detail, for example, a determination of D[0] may be performed through the same process as in the above-described normal operation mode.

FIG. 13 illustrates examples of setting specific determination periods. In the example illustrated in FIG. 13, a period corresponding to two clocks is set in the mode 1 for the highest speed when converted into clocks used for A/D conversion, for both of the sample mode and the comparator mode. A clock frequency may be variously set, and, is, for example, 128 kHz.

With respect to D[14:13], two comparison processes may be performed in order to determine data of the 2 bits as will be described later by using step S201 and step S203 (or step S204) in FIG. 14. In other words, D[14:13] requires a period corresponding to two clocks for each of the first sample mode, the first comparator mode, the second sample mode, and the second comparator mode, and thus a period corresponding to a total of eight clocks is set as a determination period. If a clock frequency is 128 kHz, a determination period of D[14:13] is 62.5 μsec.

With respect to four partitions including D[12:11] to D[6:5], three comparison processes are required to be performed in order to determine data of the 2 bits and the presence or absence of carry or borrow as will be described later by using step S206, step S208, and step S209 (or step S210 and step S211) in FIG. 14. Therefore, each of the sample mode and the comparator mode is performed three times, and each period corresponds to two clocks, and thus a period corresponding to a total of twelve clocks is set as a determination period. If a clock frequency is 128 kHz, a determination period of each partition of D[12:11] to D[6:5] is 93.75 μsec.

With respect to D[4:3], a relatively long determination period is set in order to increase the determination accuracy compared with the MSB side. In this case, contribution to the accuracy is higher in a case where a period of the comparator mode is long than in a case where a period of the sample mode is long. This is because a more time is required until a signal is stabilized in the comparator mode. Therefore, in the example illustrated in FIG. 13, in the mode 2, a period corresponding to two clocks is allocated to the sample mode, and a period corresponding to six clocks is allocated to the comparator mode. Also with respect to D[4:3], three comparison processes are performed, and thus a period corresponding to a total of twenty-four (=(2+6)×3) clocks is set as a determination period. If a clock frequency is 128 kHz, a determination period of D[4:3] is 187.5 μsec.

A longer determination period is set for D[2:1]. In the example illustrated in FIG. 13, in the mode 3, a period corresponding to twelve clocks is allocated to the comparator mode. A long sample mode can be expected to increase the accuracy, and, thus, here, a period of the sample mode expands to four clocks. Also with respect to D[2:1], three comparison processes are performed, and thus a period corresponding to a total of forty-eight (=(4+12)×3) clocks is set as a determination period. If a clock frequency is 128 kHz, a determination period of D[2:1] is 375 μsec.

A further longer determination period is set for D[0]. In the example illustrated in FIG. 13, a period corresponding to twenty-four clocks is allocated to the comparator mode, and a period corresponding to eight clocks is allocated to the sample mode. As will be described later, the same process as in the normal operation mode may be performed on D[0]. In this case, two comparison processes are performed, and thus a period corresponding to a total of sixty-four (=(8+24)×2) clocks is set as a determination period. If a clock frequency is 128 kHz, a determination period of D[0] is 500 μsec.

In the description of the normal operation mode, a specific determination period has not been described, but, as an example, in the same manner as for D[0], a period corresponding to twenty-four clocks may be allocated to the comparator mode, and a period corresponding to eight clocks may be allocated to the sample mode. Of course, the processing content or a determination period of D[0] is not necessarily be the same as in the normal operation mode, and may be variously modified.

As will be described later with reference to a flowchart of FIG. 14, the high speed mode may be a mode in which D[14:1] is determined, and D[0] is not determined in the high speed mode. In this case, the normal operation mode is performed by using, as an initial value, data of 15 bits formed of D[14:1] determined in the high speed mode and D[0] in an initial state (0 in an example which will be described later). There is a probability that a difference from an actual temperature may occur in the least significant bit or bits in the vicinity thereof, but, the difference is sufficiently small, and a great problem does not occur in a process of bringing values close to each other by k×LSB in the normal operation mode.

As can be seen from integration of conversion time in FIG. 13, A/D conversion with 15-bit accuracy can be performed, for example, within 1.5 msec, and thus the request for being within 2 msec can be satisfied.

FIGS. 12 and 13 illustrate examples of setting determination periods in the high speed mode, and various modification examples may occur. For example, the number of clocks allocated to the sample mode and the comparator mode may be set to values which are different from those in FIG. 13, and, as described above, the second and third sample modes may be omitted. Alternatively, in a case where a determination result of the MSB side is corrected on the basis of a determination result of the LSB side, for example, carry or borrow is not taken into consideration, the number of comparison processes can be reduced for each partition of D[12:11] to D[2:1], and thus it is possible to realize a higher speed. Here, a description has been made of a setting example in which determination periods are changed in four stages such as the modes 1 to 3 of the high speed mode and the normal mode, but, since determination periods are preferably different from each other on at least the MSB side and the LSB side, lengths of determination periods may be changed in two stages or three stages, and may be changed in five or more stages.

Figure 14:
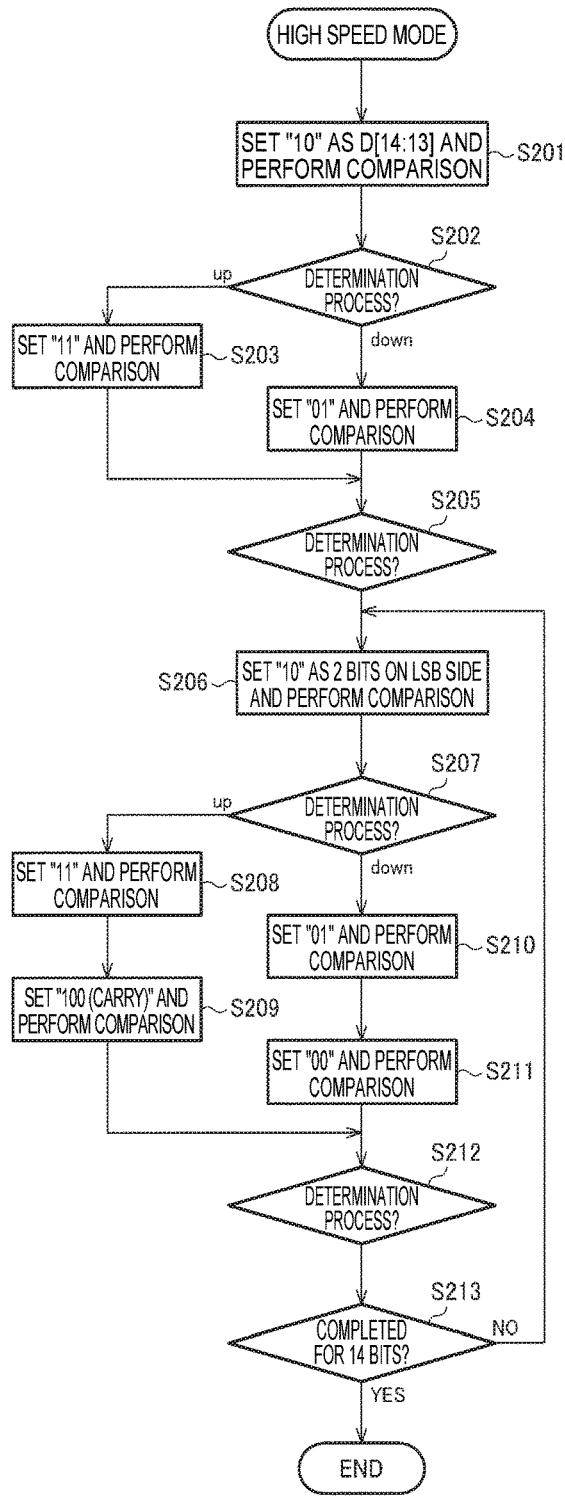
FIG. 14 is a flowchart for explaining a process in the high speed mode.

3.3.2 Correction of Determination Result of MSB Side Based on Determination Result of LSB Side FIG. 14 is a flowchart illustrating a flow of specific processes in the high speed mode. The high speed mode may be roughly classified into a portion (steps S201 to S205) for determining D[14:13] and a portion (steps S206 to S213) for determining D[12:1]. A difference between both of the two portions is the presence or absence of carry and borrow with respect to the MSB side. Hereinafter, details thereof will be described.

When the high speed mode is started, an intermediate value is set as A/D conversion result data. For example, data such as "100000000000000" is set. First, in a determination of D[14:13], data in which "10" is set as the 2 bits is D/A-converted so as to generate the D/A conversion voltage VDAC, a comparison process with the temperature detection voltage VTD is performed (step S201), and the processing circuit 23 performs a determination process based on a result thereof (step S202). Values which have already been determined or initial values may be set as other 13 bits which are not determination targets. In the case of D[14:13], D[12:0] has not been determined, and initial values are all 0, and thus data in a case where "10" is set as D[14:13] becomes "100000000000000".

In step S202, in a case where it is determined that the voltage VTD is higher than the voltage VDAC, that is, an up determination is performed, data in which "11" is set as D[14:13] is D/A-converted so as to generate the D/A conversion voltage VDAC, and a comparison process with the temperature detection voltage VTD is performed (step S203). On the other hand, in step S202, in a case where it is determined that the voltage VTD is lower than the voltage VDAC, that is, a down determination is performed, data in which "01" is set as D[14:13] is D/A-converted so as to generate the D/A conversion voltage VDAC, and a comparison process with the temperature detection voltage VTD is performed (step S204).

The processing circuit 23 determines a result in step S203 or S204 (step S205). FIG. 15 is a diagram illustrating the specific determination content. In a case where an up determination is performed at "10", and an up determination is also performed at "11" (in a case where an up determination is also performed after transition to step S203), D[14:13] is set to "11". In a case where an up determination is performed at "10", and a down determination is performed at "11" (in a case where a down determination is performed after transition to step S203), D[14:13] is set to "10". In a case where a down determination is performed at "10", and an up determination is performed at "01" (in a case where an up determination is performed after transition to step S204), D[14:13] is set to "01". In a case where a down determination is performed at "10", and a down determination is also performed at "01" (in a case where a down determination is performed after transition to step S204), D[14:13] is set to "00". The above-described process is the same as a general comparison process, and, particularly, carry and borrow may not be taken into consideration.

Next, transition to a determination process on a 2-bit LSB side occurs. First, data in which "10" is set as 2 bits of D[12:11] is D/A-converted so as to generate the D/A conversion voltage VDAC, a comparison process with the temperature detection voltage VTD is performed (step S206), and the processing circuit 23 performs a determination process based on a result thereof (step S207). The values determined in step S205 are set as D[14:13], and initial values (here, "0s") are set as D[10:0]. For example, in a case where D[14:13]="11" is determined, data set in step S206 is "111000000000000".

In a case where an up determination is performed in step S207, data in which "11" is set as D[12:11] is D/A-converted so as to generate the D/A conversion voltage VDAC, and a comparison process with the temperature detection voltage VTD is performed (step S208). However, in a case where "11" is set, even if it is determined that the voltage VTD is higher than the voltage VDAC, as described in step S205, D[12:11] is only determined as being "11", and thus bits (here, D[14:13]) located further toward the MSB side cannot be corrected. Therefore, in order to take into consideration carry, a greater value than "11" is required to be set as D[12:11].

Specifically, data in which data in a state of carry occurring is set is D/A-converted so as to generate the D/A conversion voltage VDAC, and a comparison process with the temperature detection voltage VTD is performed (step S209). In this example, D[12:11] may be set to "00", and a value of D[13] may be increased by 1. For example, in a case where it is determined that D[14:13] is "01", D[14:11] is set to "1000". In other words, D[14:11] is set to "0111" in step S208, and "1000" which is greater than the value is set in step S209.

In a case where a down determination is performed in step S207, data in which "01" is set as D[12:11] is D/A-converted so as to generate the D/A conversion voltage VDAC, and a comparison process with the temperature detection voltage VTD is performed (step S210). However, in a case where "01" is set, even if it is determined that the voltage VTD is lower than the voltage VDAC, as described in step S205, D[12:11] is only determined as being "00", and thus correction (specifically, correction for reducing values) of bits located further toward the MSB side cannot be performed. Therefore, in order to take into consideration borrow, a smaller value than "01" is required to be set as D[12:11]. Specifically, data in which "00" is set as D[12:11] is D/A-converted so as to generate the D/A conversion voltage VDAC, and a comparison process with the temperature detection voltage VTD is performed (step S211).

The processing circuit 23 performs a determination based on comparison results in steps S208 and S209 or steps S210 and S211. FIG. 16 is a diagram illustrating the specific determination content. First, a description will be made of a case where an up determination is performed in step S207. In this case, comparison processes are performed in steps S208 and S209, and an up determination and a down determination may be performed in each step, and thus a total of four patterns may be present.

In a case where an up determination is performed in both of steps S208 and S209, it can be seen that the temperature detection voltage VTD is high to the extent that carry is necessary. Therefore, values of 2 bits which are determination targets are determined to be "00", and 1 is added to one bit on the MSB side. In a case where a down determination is performed in both of steps S208 and S209, it can be seen that the temperature detection voltage VTD is located between a case where "10" is set and a case where "11" is set, and thus values of 2 bits which are determination targets are determined to be "10".

In a case where an up determination is performed in step S208 and a down determination is performed in step S209, it can be seen that the temperature detection voltage VTD is located between a case where "11" is set and a case where carry occurs, and thus values of 2 bits which are determination targets are determined to be "11".

In a case where a down determination is performed in step S208, and an up determination is performed in step S209, it can be seen that this case corresponds to an error state which does not normally occur. There may be various processes in a case of the error state, but, here, values such as "11" are set.

Next, a description will be made of a case where a down determination is performed in step S207. In this case, comparison processes are performed in steps S210 and S211, and an up determination and a down determination may be performed in each step, and thus a total of four patterns may be present.

In a case where a down determination is performed in both of steps S210 and S211, it can be seen that the temperature detection voltage VTD is located between a case where "01" is set and a case where "10" is set, and thus values of 2 bits which are determination targets are determined to be "01". In a case where a down determination is performed in both of steps S210 and S211, it can be seen that the temperature detection voltage VTD is low to the extent that borrow is necessary. Therefore, values of 2 bits which are determination targets are determined to be "11", and 1 is subtracted from one bit on the MSB side. For example, in a case where D[14:13]="10", and it is determined that borrow is necessary in D[12:11], D[14:11] may be determined to be "0111".

In a case where a down determination is performed in step S210, and an up determination is performed in step S211, it can be seen that the temperature detection voltage VTD is located between a case where "00" is set and a case where "01" is set, and thus values of 2 bits which are determination targets are determined to be "00".

In a case where a down determination is performed in step S210, and an up determination is performed in step S211, it can be seen that this case corresponds to an error state which does not normally occur. There may be various processes in a case of the error state, but, here, values such as "00" are set.

3.4 Transition Example of Operation Mode of A/D Conversion Circuit

Each of the normal operation mode and the high speed mode has merits and demerits, and the modes preferably switch therebetween depending on situations. Hereinafter, a description will be made of a specific example of mode switching.

Figure 17:
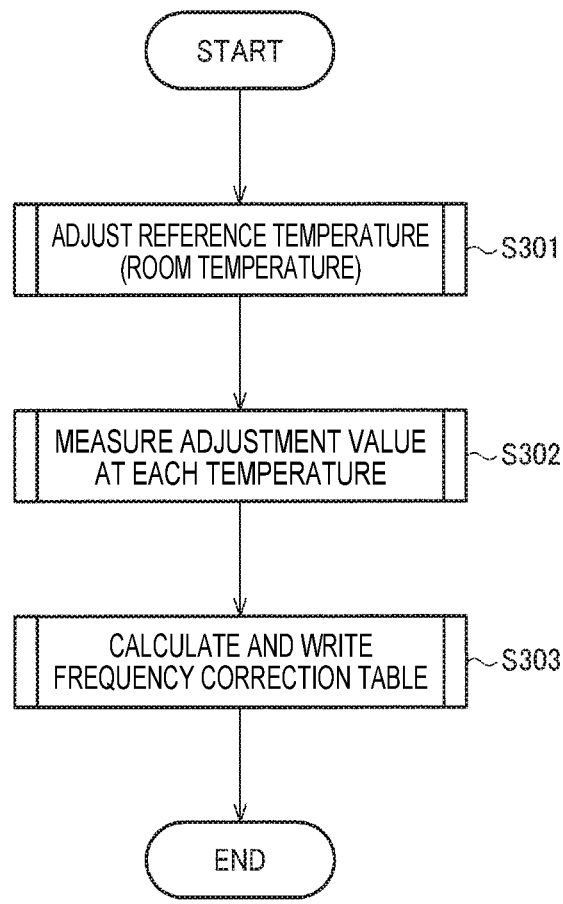
FIG. 17 is a flowchart for explaining a process during manufacturing.

FIG. 17 is a flowchart for explaining a process performed during manufacturing. Each step in FIG. 17 (and FIGS. 18 and 19) is performed by a processor of a device (an external device which is different from the circuit device) used during manufacturing. However, some processes may be performed by the circuit device (in a narrow sense, the digital signal processing circuit 50).

During manufacturing, first, adjustment is performed at a reference temperature (step S301). The reference temperature here is the room temperature, and is, for example, 25° C. However, other temperatures may be used as the reference temperature.

Figure 18:
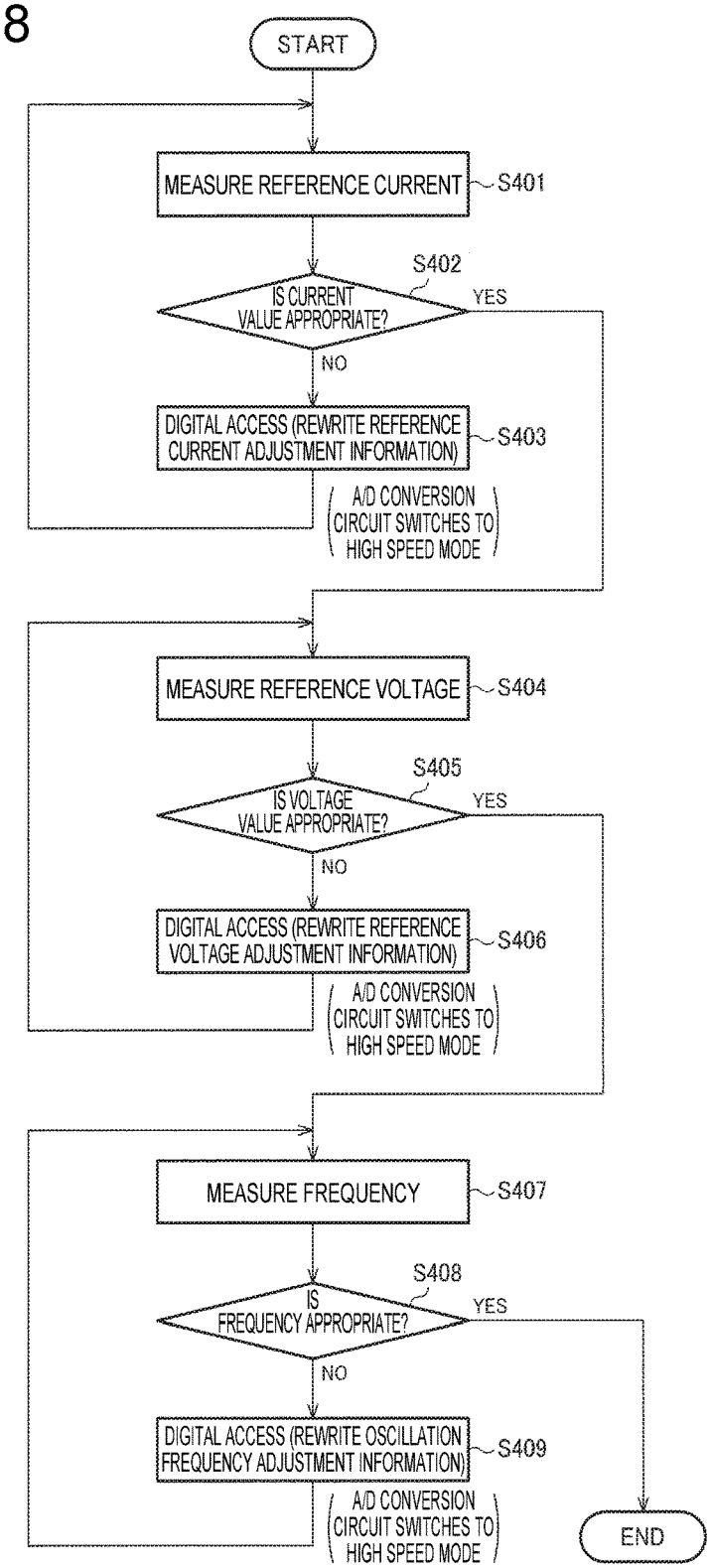
FIG. 18 is a flowchart for explaining adjustment in a reference temperature.

FIG. 18 is a flowchart for explaining details of adjustment (step S301) at the reference temperature. At the reference temperature, adjustment of a reference current (steps S401 to S403), adjustment of a reference voltage (steps S404 to S406), and adjustment of an oscillation frequency (steps S407 to S409) are performed.

The reference voltage here is a voltage supplied to each unit of the circuit device, and is used to determine a full-scale voltage for A/D conversion in the A/D conversion circuit 20. The reference voltage is a voltage generated by, for example, a reference voltage generation circuit, and the reference voltage generation circuit may be a circuit using a work function difference. The reference current is a current used to generate the reference voltage, for example, in the reference voltage generation circuit, but may be used in other portions of the circuit device. As mentioned above, the reference voltage and the reference current determine characteristics of the circuit device, and is thus required to be adjusted to be sufficiently close to a predetermined pre-defined value.

In the TCXO, it is necessary to stabilize an oscillation frequency in a wide temperature range by compensating for temperature characteristics of the resonator. It is natural that a signal with a desired oscillation frequency (for example, 26 MHz) has to be output at the reference temperature.

In a case of the above-described example, a value of the reference voltage is changed by adjusting the reference current. Therefore, in the example illustrated in FIG. 18, first, the reference current is adjusted. Specifically, an external device measures a value of the reference current (step S401), and determines whether or not a current value is appropriate, specifically, the current value is sufficiently close to a desired value (step S402). The circuit device has a node (terminal) from which the reference current is output, and thus allows the external device to measure the reference current.

In a case where the current value is not sufficiently close to the desired value in step S402, the reference current is adjusted to have the desired value. Specifically, parameters (reference current adjustment information) used to adjust the reference current are stored in a predetermined region of the storage unit 180 (memory) of the circuit device. Therefore, the external device performs digital access via the terminal T3 and the interface 170 so as to rewrite the reference current adjustment information (step S403).

After the process in step S403, the flow returns to step S401 again, and the reference current is measured and it is determined whether or not the reference current is appropriate. In a case where the reference current reaches the desired value (Yes in step S402), the flow proceeds to step S404, and the reference voltage starts to be adjusted.

Adjustment of the reference voltage is performed in the same manner as adjustment of the reference current. In other words, the external device measures a value of the reference voltage (step S404), determines whether or not a voltage value is appropriate (step S405), rewrites reference voltage adjustment information in the storage unit 180 (memory) of the circuit device (step S406) in a case where the voltage value is not appropriate (No in step S405), and returns to step S404. In a case where it is determined that the voltage value is appropriate (Yes in step S405), the external device proceeds to step S407, and starts adjustment of an oscillation frequency at the reference temperature.

Through the above-described processes, the reference current and the reference voltage are adjusted. Here, the reference current and the reference voltage are used for A/D conversion, and thus there is a probability of the occurrence of a difference between the temperature detection voltage VTD and the temperature detection data DTD due to the digital access in step S403 or S406. In steps S401 to S406, the temperature detection data DTD (an A/D conversion result or an AD value) is not used for the processes, and thus there is no problem even if the difference occurs. However, in a case where processes based on the temperature detection data DTD are performed in the subsequent processes, there is a possibility that an appropriate process cannot be performed due to a difference in the temperature detection data DTD.

In the example illustrated in FIG. 18, in a case where the voltage value is appropriate in step S405, a frequency of a signal output from the circuit device is measured in order to adjust an oscillation frequency (step S407). The oscillation frequency here is a frequency based on the frequency control data DDS which is an output from the digital signal processing circuit 50, and the frequency control data DDS is determined on the basis of the temperature detection data DTD from the A/D conversion circuit 20. In other words, a value of the temperature detection data DTD is required to converge on a value corresponding to the temperature detection voltage VTD (the difference is required to be removed) before a frequency is measured in step S407. As indicated by A1 in FIG. 5, in a case where the circuit device operates in the normal operation mode, a measurement waiting time required for starting of step S407 is increased.

Particularly, in the example illustrated in FIG. 18, adjustment of the reference current or the reference voltage can be performed at a high speed to some extent. Thus, step S407 is frequently started in a state in which the difference between the temperature detection voltage VTD and the temperature detection data DTD due to the digital access in step S403 or S406 is not removed.

Therefore, in the present embodiment, the digital access shown in step S403 or S406 is used as a trigger of switching to the second mode (high speed mode). In other words, the digital access is an example of a predetermined condition. Specifically, as illustrated in FIG. 7, the circuit device includes the interface 170 and the storage unit 180 to which circuit constant setting information of the circuit device is written via the interface 170, and the A/D conversion circuit 20 switches to the high speed mode in a case where the circuit constant setting information is written via the interface 170. Here, the circuit constant setting information may be at least one of the reference voltage adjustment information and the reference current adjustment information.

In this case, the A/D conversion circuit 20 may switch to the high speed mode on the basis of a switching signal from the interface 170. In other words, the switching signal being input may be a predetermined condition. Specifically, the interface 170 includes a logic circuit, and the logic circuit is configured to output the switching signal to the A/D conversion circuit 20 in a case where digital access for writing the circuit constant setting information is performed (in a narrow sense, in a case where the digital access is finished). The switching signal here is the signal ACCESS_HS in FIG. 6. However, the switching signal may be output from the digital signal processing circuit 50 or the like.

In the above-described way, in a case where the digital access for writing the circuit constant setting information is performed, the A/D conversion circuit 20 switches to the high speed mode. The circuit constant setting information is parameters for determining operation characteristics of a circuit, and thus there is a probability that an ideal value (a value corresponding to the temperature detection voltage VTD) of the temperature detection data DTD may greatly change due to rewriting. In relation to this fact, it is possible to change (track) the temperature detection data DTD at a high speed due to switching to the high speed mode.

Figure 20:
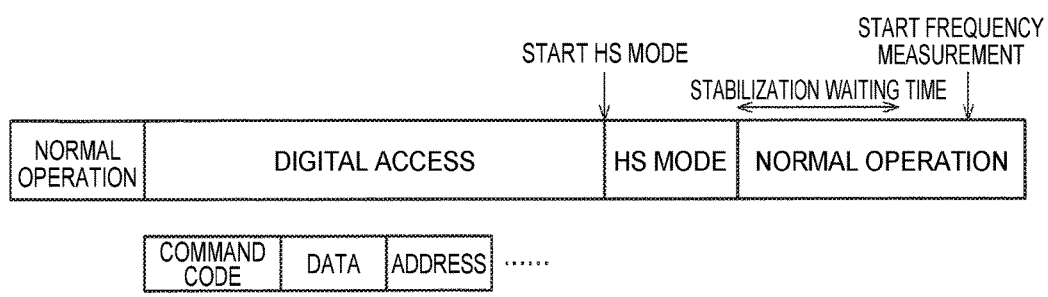
FIG. 20 illustrates an operation example of the A/D conversion circuit at the time of mode switching.

FIG. 20 is a diagram for explaining an operation of the A/D conversion circuit 20 in a case where switching to the high speed mode occurs. A transverse axis in FIG. 20 expresses time. First, the A/D conversion circuit 20 operates in the normal operation mode. Digital access is performed in step S403 or S406. For example, as illustrated in FIG. 20, the digital access is transmission and reception processes of a data sequence (bit sequence) including a command code, data, and an address. The command code is a write command for the storage unit 180 (memory) here, but may be a read command from the storage unit 180 or a command for giving an instruction for an ON or OFF of a predetermined block (for example, a test circuit) of the circuit device. The address is an address indicating a region of the storage unit 180 which is an access target, and the data is written at the address.

When the digital access is finished, the switching signal (ACCESS_HS) is output, and thus the high speed mode is started. If the high speed mode is executed, the difference between the temperature detection voltage VTD and the temperature detection data DTD is removed, and thus the A/D conversion circuit 20 returns to the normal operation mode. Thereafter, waiting occurs for only a short period of time required for stabilization of the oscillation frequency, and then measurement of a frequency can be started.

Referring to FIG. 18 again, the external device measures an oscillation frequency (step S407), determines whether or not the frequency is appropriate (step S408), rewrites oscillation frequency adjustment information in the storage unit 180 (memory) of the circuit device (step S409) in a case where the frequency is not appropriate (No in step S408), and returns to step S407.

Here, there may be various specific examples of the oscillation frequency adjustment information, but information for adjusting a predetermined reference voltage value used in the circuit device may be used. The circuit constant setting information may include the oscillation frequency adjustment information. In other words, in a case where digital access for rewriting the oscillation frequency adjustment information is performed in step S409, the A/D conversion circuit 20 switches to the high speed mode. In the above-described way, it is possible to reduce a measurement waiting time in measurement of when the flow returns to step S407 from step S409. In a case where it is determined that the frequency is appropriate (Yes in step S408), the external device finishes adjustment at the reference temperature (steps S302 and S303 in FIG. 17).

Next, the external device calculates and stores a frequency correction table (coefficient data) such that a signal with a desired oscillation frequency can be output by performing an appropriate temperature correction process even at a temperature which is different from the reference temperature.

There may be various techniques of calculating the coefficient data. For example, an AD value (temperature detection data DTD) at a predetermined temperature is obtained, and DAC input data (frequency control data DDS) for outputting a signal with a desired oscillation frequency at the temperature is also obtained. In the above-described way, a single set of values of the temperature detection data DTD and the frequency control data DDS for outputting a signal with the desired oscillation frequency is obtained. In other words, a single point based on actually measured values can be plotted on the coordinate system in FIG. 9. The external device may plot a plurality of points while changing temperatures, and may create the temperature compensation table illustrated in FIG. 9 on the basis of the points. For example, in a case where the temperature compensation table is approximated by using an n-th order (where n is a positive integer, and is 5, for example), (n+1) coefficients including a 0-th order coefficient to an n-th order coefficient are obtained. Therefore, sets of values of the temperature detection data DTD and the frequency control data DDS at (n+1) different temperatures, and thus coefficient data for approximating an appropriate temperature compensation table can be calculated.

Figure 19:
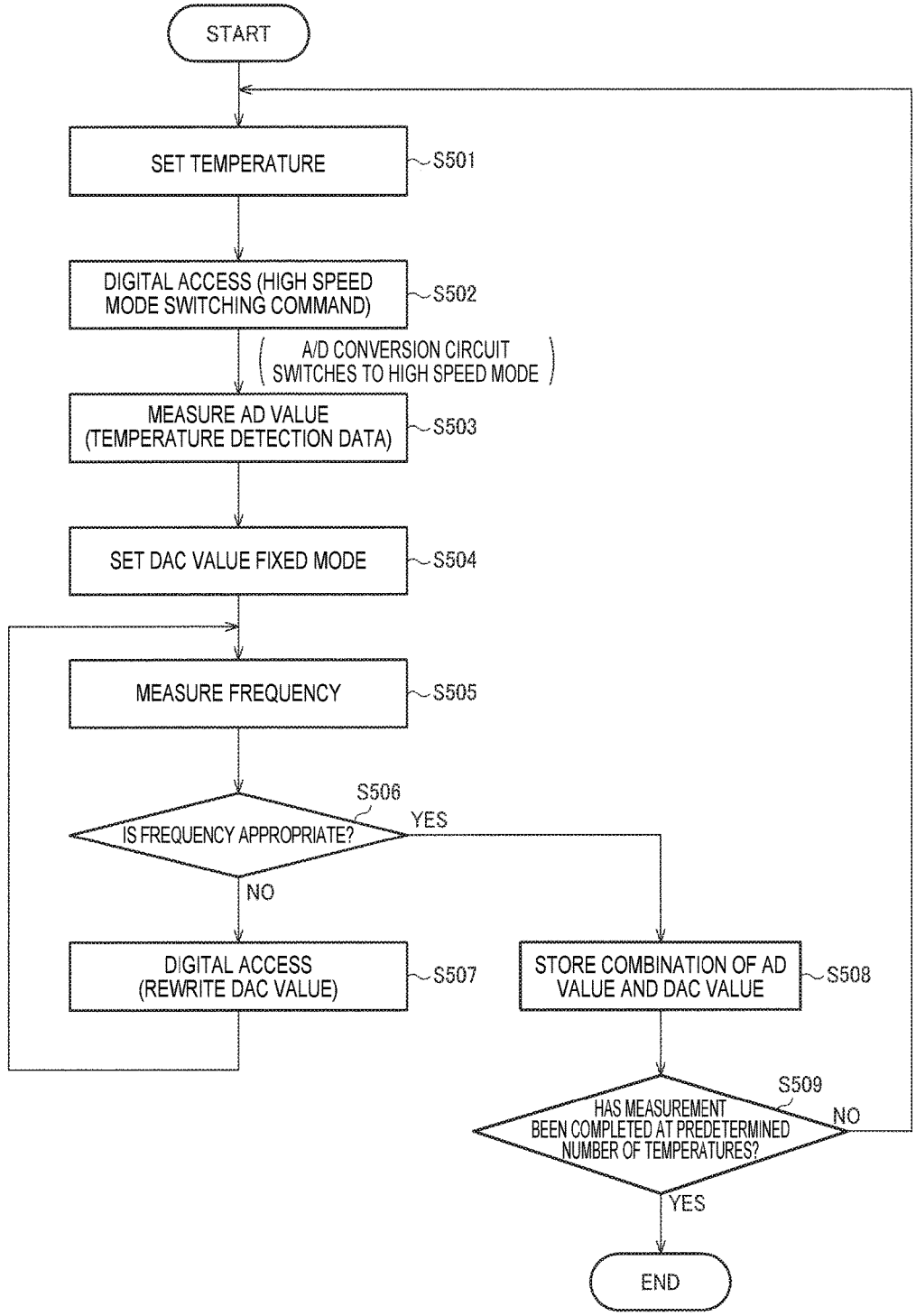
FIG. 19 is a flowchart for explaining adjustment value measurement at each temperature.

FIG. 19 is a flowchart for explaining the process in step S302 in FIG. 17. If this process is started, first, an environmental temperature of the circuit device is set to a predetermined value (step S501). This may be performed by setting, for example, the temperature of a thermostatic tank, may be performed by the external device, and may be performed by a control device of the thermostatic tank.

Since a temperature changes due to the setting in step S501 more suddenly than under the natural environment, in the normal operation mode, a change in the temperature detection data DTD cannot track a change in the temperature (temperature detection voltage VTD), and thus a waiting time for measuring the temperature detection data DTD is required. Therefore, in the present embodiment, the A/D conversion circuit 20 switches to the high speed mode after the setting is performed in step S501. For example, data including a command code for switching to the high speed mode may be transmitted to the circuit device from the external device through digital access (step S502).

In other words, in a case where a command for switching to the high speed mode is input via the interface 170, the A/D conversion circuit 20 may switch to the high speed mode. In other words, the switching command being input may be a predetermined condition. For example, the interface 170 includes a logic circuit, and the logic circuit is configured to output a switching signal to the A/D conversion circuit 20 in a case where digital access including the switching command is performed. In this case, in the digital access shown in FIG. 20, only a command code may be transmitted, and data or an address may be omitted.

In the above-described way, data access to the storage unit 180 is not necessary unlike in step S403 or the like in FIG. 18. In other words, the A/D conversion circuit 20 can be caused to switch to the high speed mode at a high speed through simple control. The A/D conversion circuit 20 operates at the high speed mode, and can thus track a temperature change caused by a result of step S501. Therefore, it is possible to reduce a measurement waiting time in measurement (step S503) of the temperature detection data DTD.

In step S301, the circuit constant setting information such as the reference voltage is defined, and thus it is considered that the temperature detection data DTD can be calculated (not required to be actually measured) on the basis of the circuit constant setting information and a temperature. However, in an actual circuit device, the temperature detection data DTD may be deviated due to an individual difference or the like, and thus coefficient data can be obtained with high accuracy by actually measuring the temperature detection data DTD as in step S503.

Next, the external device sets the circuit device to a DAC value fixed mode (step S504). The DAC value fixed mode is a mode in which an input value for the D/A conversion circuit 80 can be fixed to a desired value, and, for example, data stored in a predetermined region of the storage unit 180 is used as an input value (DAC value) for the D/A conversion circuit 80. In other words, in the DAC value fixed mode, an input value for the D/A conversion circuit 80 may be set to any value regardless of a value of the temperature detection data DTD.

The external device measures an oscillation frequency (step S505), and determines whether or not the frequency is a desired oscillation frequency (step S506). In a case where the frequency is not the desired oscillation frequency in step S506, the external device performs digital access for rewriting the DAC value in the storage unit 180 (step S507). Since, through the process in step S507, an input value for the D/A conversion circuit 80 changes, and thus an oscillation frequency also changes, the external device measures a frequency, and determines whether or not the frequency is the desired oscillation frequency again (steps S505 and S506).

In a case where the frequency is the desired oscillation frequency in step S506, the DAC value at this time is an input value for the D/A conversion circuit 80, for realizing the desired oscillation frequency at the temperature set in step S501. Therefore, the DAC value and the temperature detection data DTD measured in step S503 are stored as a set (step S508). Through the above-described processes, plotting of a single point for the coordinate in FIG. 9 is finished.

Therefore, the external device determines whether or not measurement at a predetermined number of (for example, (n+1) described above) temperatures is finished (step S509), and returns to step S501 in a case where there is a temperature at which measurement is not performed, and continuously performs measurement by using different temperatures. In a case where measurement is completed at all temperatures, and the process in step S302 is finished.

A set of values of the temperature detection data DTD and a DAC value for realizing the desired oscillation frequency is acquired through the process in FIG. 19 (step S302). Therefore, the external device calculates coefficient data on the basis of the acquired values, and stores the coefficient data in the storage unit 180 (the ROM in a narrow sense) of the circuit device (step S303). As a process of calculating the coefficient data, for example, a process of solving simultaneous equations (in a broad sense, a process of obtaining an optimal solution) may be performed.

In the above description, the description has been made of switching to the high speed mode with steps S403, S406 and S409 in FIG. 18 and step S502 in FIG. 19 as triggers. In this case, the A/D conversion circuit 20 may switch to the high speed mode when a predetermined condition is established, and may switch to the normal operation mode after outputting the temperature detection data DTD which is an A/D conversion result in the high speed mode.

In the above-described way, the A/D conversion circuit 20 can rapidly return to the normal operation mode after transition to the high speed mode. In other words, it is possible to minimize the occurrence of frequency hopping. Outputting of the temperature detection data DTD may be determined by the logic section 22 of the A/D conversion circuit 20, and may be determined by the digital signal processing circuit 50. A signal indicating that the temperature detection data DTD has been output may be temporarily returned to the interface 170, and a switching signal for switching to the normal operation mode may be output from the interface 170 to the A/D conversion circuit 20. In addition, control of switching from the high speed mode to the normal operation mode may be variously modified.

3.5 Modification Examples of Operation Mode Transition

Hereinafter, several modification examples will be described. In FIG. 19, a temperature is set, and then a command for switching to the high speed mode is output through digital access (step S502). In contrast, the A/D conversion circuit 20 may include the temperature change detection circuit 29 as illustrated in FIG. 6, and may switch to the high speed mode in a case where a predetermined temperature change is detected by the temperature change detection circuit 29. In other words, the predetermined temperature change being detected may be a predetermined condition. Specifically, in a case where the predetermined temperature change is detected, the temperature change detection circuit 29 outputs a signal DTEMP_HS having an H level (active).

Here, the temperature change detection circuit 29 may be, for example, a circuit which counts the number of consecutive up determinations or the number of consecutive down determinations in the comparison circuit 27. As described above, in a situation in which a temperature change is slight under the natural environment, an output change for 1LSB merely occurs about once for several tens of frames. In two comparison results in the normal operation mode, both of the results of up determinations (both of the results of down determinations) are rare, and, in many cases, one result is an up determination, and the other result is a down determination. In other words, in the temperature change detection circuit 29, in a case where the same determination result continues for a certain number of times, it can be estimated that a sudden temperature change which is not normally expected has occurred. The number of times here may be set to various values, and may be set to, for example, about 20 to 100.

In the above-described way, an explicit switching command is not required to be input from an external device unlike in the example of step S502 in FIG. 19. Specifically, the temperature change detection circuit 29 may be turned on at any timing in the normal operation mode. Turning on and off of the temperature change detection circuit 29 may be controlled through digital access. Consequently, in a case where it is hard for the temperature detection data DTD to track a temperature change in a state of the normal operation mode, the circuit device side can automatically switch to the high speed mode.

In a period in which the A/D conversion circuit 20 does not operate, for example, during stopping or sleeping of the circuit device, the temperature detection data DTD is not output. Thus, during activation (during returning from a stopping state or a sleeping state), the previous temperature detection data DTD" is data not corresponding to a temperature. Therefore, the A/D conversion circuit 20 preferably operates in the high speed mode in an activation period.

The A/D conversion circuit 20 operates in the high speed mode in the activation period, so as to output the temperature detection data DTD which is an A/D conversion result in the high speed mode, and then switches to the normal operation mode. The A/D conversion circuit 20 switches to the high speed mode in a case where a predetermined condition is established after switching to the normal operation mode.

In the above-described way, the A/D conversion circuit 20 can be operated in an appropriate mode even in the activation period. In other words, it is possible to rapidly stabilize a frequency of an output signal after activation, to minimize a frequency drift by using the normal operation mode after stabilization, and to transition to the high speed mode at any time as necessary even after transition to the normal operation mode. Specifically, the power-on reset circuit or the like which operates in the activation period may output the signal VSTART_HS giving an instruction for switching to the high speed mode.

A description has been made of a technique of returning to the normal operation mode in a case where the temperature detection data DTD is output in the high speed mode after switching to the high speed mode. However, a technique according to the present embodiment is not limited thereto. Specifically, in a case where a predetermined condition is satisfied, and thus switching to the high speed mode occurs, the A/D conversion circuit 20 may be kept in the high speed mode even after the temperature detection data DTD is output.

For example, during manufacturing illustrated in FIGS. 17 to 19, the high speed mode is frequently used. A deviation in a frequency of an output signal hinders measurement, but this causes less problems in a case where frequency hopping occurs since unlocking of a GPS or the like is not required to be taken into consideration at this time. Thus, the A/D conversion circuit 20 may be kept in the high speed mode. Here, the time of manufacturing has been described as an example, but the high speed mode may be continued in other situations. For example, the high speed mode may be continued instead of being executed only once, for example, in a situation in which a probability of frequency hopping is low, there is no problem even if frequency hopping occurs, or tracking property of the temperature detection data DTD is necessary even if some frequency hopping is allowed. In this case, the A/D conversion circuit 20 may automatically switch to the normal operation mode in a case where the high speed mode is continued for a predetermined number of times or for a predetermined period of time, and may switch to the normal operation mode with reception of a switching signal as a trigger.

4. Modification Example of Oscillation Signal Generation Circuit

Figure 21:
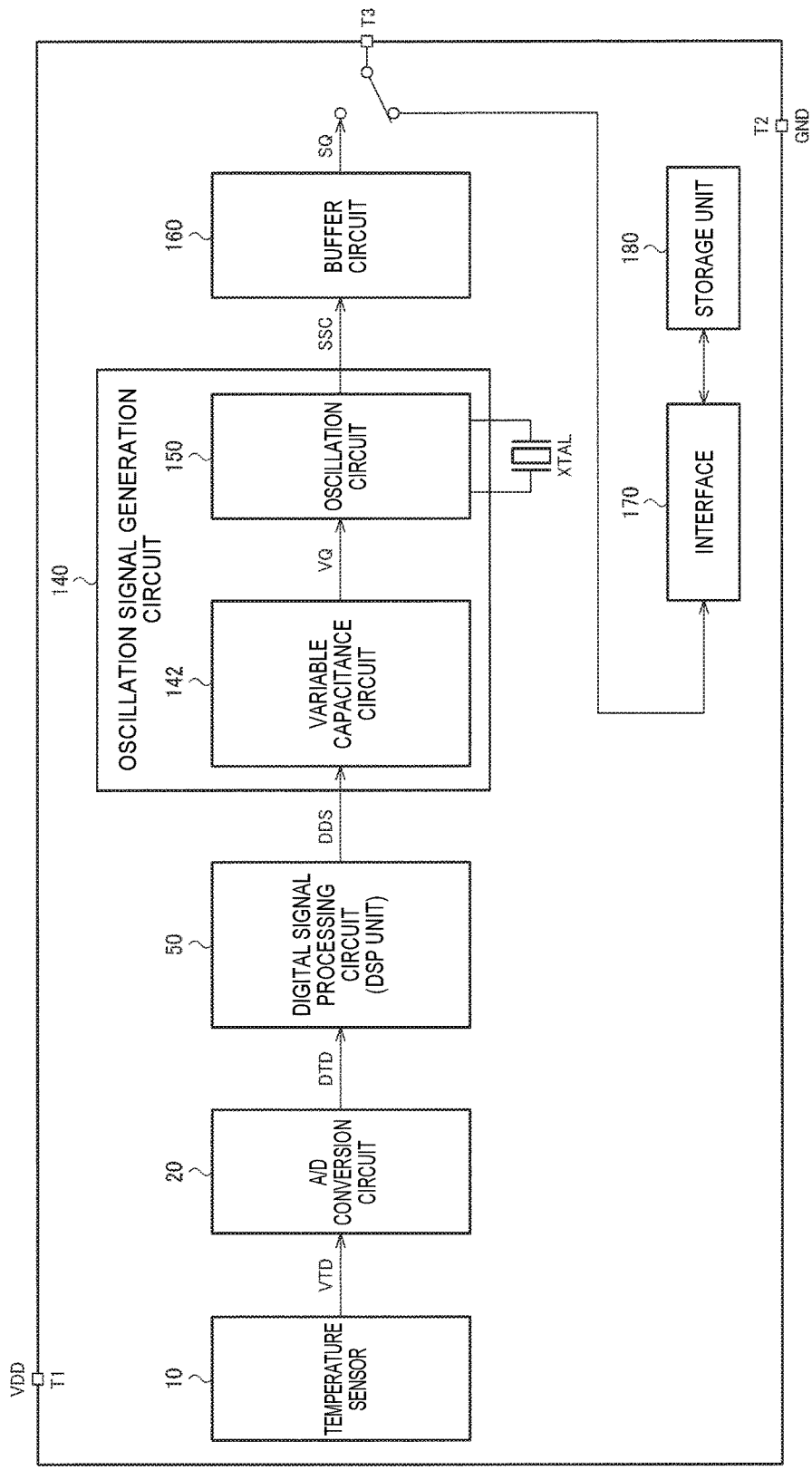
FIG. 21 illustrates another configuration example of the circuit device.

FIG. 21 illustrates a configuration example of a circuit device according to a modification example of the present embodiment. The circuit device illustrated in FIG. 21 includes an A/D conversion circuit 20 which performs A/D conversion on temperature detection voltage VTD from a temperature sensor 10 so as to output temperature detection data DTD, a digital signal processing circuit 50 which performs a temperature compensation process on an oscillation frequency on the basis of the temperature detection data DTD, so as to output frequency control data DDS of the oscillation frequency, and an oscillation signal generation circuit 140.

The oscillation signal generation circuit 140 generates an oscillation signal SSC having an oscillation frequency set by the frequency control data DDS by using the frequency control data DDS from the digital signal processing circuit 50 and the resonator XTAL.

In other words, in FIG. 21, the D/A conversion circuit 80 is not provided in the oscillation signal generation circuit 140 unlike FIG. 7. The oscillation frequency of the oscillation signal SSC generated by the oscillation signal generation circuit 140 is directly controlled on the basis of the frequency control data DDS from the digital signal processing circuit 50. In other words, the oscillation frequency of the oscillation signal SSC is controlled without using the D/A conversion circuit.

For example, in FIG. 21, the oscillation signal generation circuit 140 includes a variable capacitance circuit 142 and an oscillation circuit 150. The oscillation signal generation circuit 140 is not provided with the D/A conversion circuit 80 illustrated in FIG. 7. One end of the variable capacitance circuit 142 is connected to one end of the resonator XTAL.

A capacitance value of the variable capacitance circuit 142 is controlled on the basis of the frequency control data DDS from the digital signal processing circuit 50. For example, the variable capacitance circuit 142 is provided with a plurality of capacitors (capacitor array), and a plurality of switch elements (switch array) each of which allows turning-on and turning-off to be controlled on the basis of the frequency control data DDS. Each of the plurality of switch elements is electrically connected to each of the plurality of capacitors. The plurality of switch elements are turned on or off, and thus the number of capacitors whose one ends are connected to one end of the resonator XTAL among the plurality of capacitors changes. Consequently, a capacitance value of the variable capacitance circuit 142 is controlled, and thus a capacitance value of the resonator XTAL changes. Therefore, a capacitance value of the variable capacitance circuit 142 can be directly controlled by the frequency control data DDS, and thus an oscillation frequency of the oscillation signal SSC can be controlled.

5. Oscillator, Electronic Apparatus, and Vehicle

Figure 22:
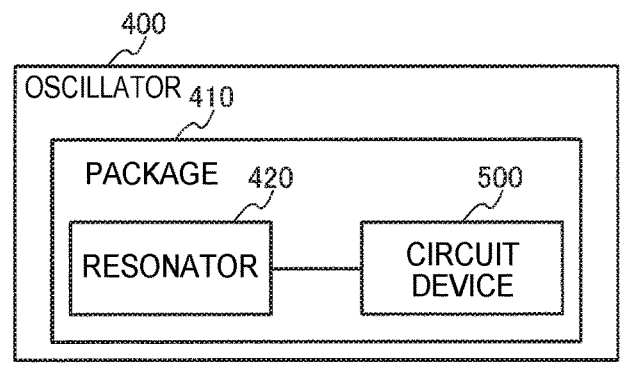
FIG. 22 illustrates a configuration example of an oscillator.

FIG. 22 illustrates a configuration example of an oscillator 400 provided with a circuit device 500 of the present embodiment. As illustrated in FIG. 22, the oscillator 400 includes a resonator 420 and the circuit device 500. The resonator 420 and the circuit device 500 are mounted in a package 410 of the oscillator 400. A terminal of the resonator 420 is electrically connected to a terminal (pad) of the circuit device 500 (IC) via an internal wiring of the package 410.

Figure 23:
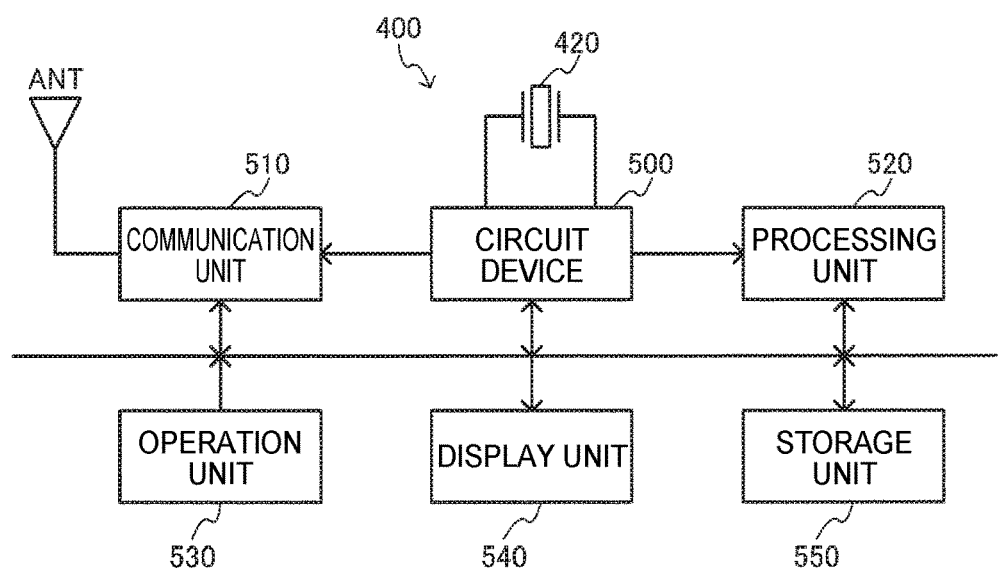
FIG. 23 illustrates a configuration example of an electronic apparatus.

FIG. 23 illustrates a configuration example of an electronic apparatus including the circuit device 500 of the present embodiment. The electronic apparatus includes the circuit device 500 of the present embodiment, the resonator 420 such as a quartz crystal resonator, an antenna ANT, a communication unit 510, a processing unit 520, and the like. The electronic apparatus may include an operation unit 530, a display unit 540, and a storage unit 550. The oscillator 400 is formed of the resonator 420 and the circuit device 500. A configuration of the electronic apparatus is not limited to the configuration illustrated in FIG. 23, and may be variously modified by omitting some constituent elements or adding other constituent elements thereto.

As the electronic apparatus illustrated in FIG. 23, there may be various apparatuses, for example, a GPS built-in clock, a wearable apparatus such as a biological information measurement apparatus (a sphygmograph, a pedometer, or the like) or a head mounted display, a portable information terminal (mobile terminal) such as a smart phone, a mobile phone, a portable game apparatus, a notebook PC, or a tablet PC, a content providing terminal which delivers content, a video apparatus such as a digital camera or a video camera, and a network related apparatus such as a base station or a router.

The communication unit 510 (wireless circuit) performs a process of receiving data from an external apparatus or transmitting data to the external apparatus, via the antenna ANT. The processing unit 520 performs a process of controlling the electronic apparatus, or various digital processes on data which is transmitted and received via the communication unit 510. The function of the processing unit 520 may be realized by, for example, a processor such as a microcomputer.

The operation unit 530 is used for a user to perform an input operation, and may be implemented by, for example, an operation button or a touch panel display. The display unit 540 displays various pieces of information, and may be implemented by, for example, a liquid crystal display or an organic EL display. In a case where a touch panel display is used as the operation unit 530, the touch panel display also functions as the operation unit 530 and the display unit 540. The storage unit 550 stores data, and a function thereof may be realized by a semiconductor memory such as a RAM or a ROM, or a hard disk drive (HDD).

Figure 24:
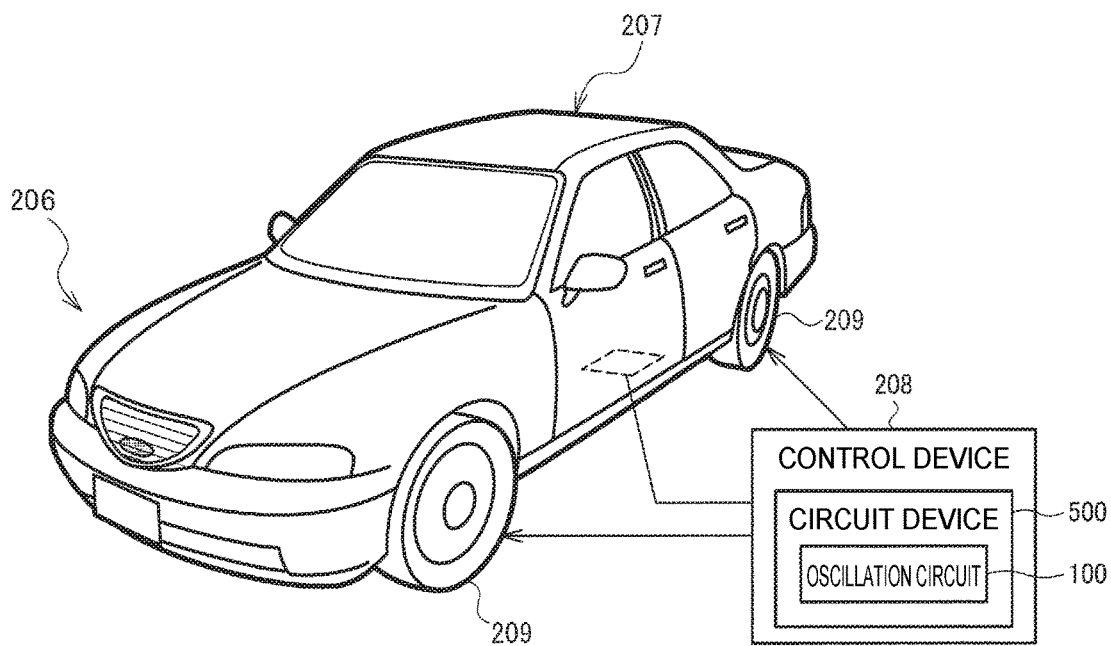
FIG. 24 illustrates a configuration example of a vehicle.

FIG. 24 illustrates an example of a vehicle including the circuit device of the present embodiment. The circuit device 500 (oscillator) of the present embodiment may be incorporated into, for example, various vehicles such as a car, an aircraft, a motorbike, a bicycle, and a ship. The vehicles are pieces of equipment or instruments which are provided with, for example, driving mechanisms such as engines or motors, steering mechanisms such as handles or rudders, and various electronic apparatuses (on-vehicle apparatuses), and move on the ground, in the air, and in the sea. FIG. 24 schematically illustrates an automobile 206 as a specific example of the vehicle. The oscillator (not illustrated) including the circuit device and the resonator of the present embodiment is incorporated into the automobile 206. A control device 208 operates on the basis of a clock signal generated by the oscillator. The control device 208 controls hardness and softness of a suspension or a brake of each car wheel 209, for example, in accordance with the attitude of a car body 207. For example, automatic driving of the automobile 206 may be realized by the control device 208. An apparatus into which the circuit device or the oscillator of the present embodiment is incorporated is not limited to the control device 208, and the circuit device or the oscillator of the present embodiment may be incorporated into various apparatuses (on-vehicle apparatuses) provided in a vehicle such as the automobile 206.

The technique of the present embodiment is applicable to a manufacturing method for the circuit device performing A/D conversion on a temperature detection voltage from the temperature sensor 10, and outputting temperature detection data. The circuit device includes the A/D conversion circuit 20, the storage unit 180, and the interface 170. In the manufacturing method for the circuit device, measurement for determining circuit constant setting information is performed, and an operation of the A/D conversion circuit 20 switches from the first mode in which an A/D conversion process is performed according to a first A/D conversion method in order to obtain the temperature detection data DTD to the second mode in which an A/D conversion process is performed according to a second A/D conversion method which is different from the first A/D conversion method in order to obtain the temperature detection data DTD, when the circuit constant setting information is written to the storage unit 180 via the interface 170 on the basis of a result of the measurement.

The measurement for determining the circuit constant setting information corresponds to, for example, steps S401, S404 and S407 in FIG. 18. Switching of the A/D conversion circuit 20 to the second mode corresponds to steps S403, S406 and S409. In the above-described way, it is possible to realize a manufacturing method for the circuit device, capable of reducing the time or cost required for manufacturing.

In step S502 in FIG. 19 and a modification example thereof, as described above, transmission of a switching command or detection of a temperature change may be used as a trigger for causing the A/D conversion circuit 20 to switch to the second mode. In other words, the manufacturing method according to the present embodiment can be expanded to various techniques of performing switching from the first mode to the second mode during measurement for determining the circuit constant setting information.

Although the present embodiment has been described as above in detail, it can be easily understood by a person skilled in the art that various modifications without substantially departing from the new matters and effects of the invention are possible. Therefore, these modifications are all included in the scope of the invention. For example, in the specification or the drawings, the terminologies which are mentioned at least once along with different terminologies which have broader meanings or the same meanings may be replaced with the different terminologies in any location of the specification or the drawings. All combinations of the present embodiment and the modification examples are included in the scope of the invention. In addition, configurations or operations of the circuit device, the oscillator, the electronic apparatus, or the vehicle, A/D conversion techniques, D/A conversion techniques, frequency control data processing techniques, frequency control techniques for the resonator, and the like, are also not limited to the above description of the present embodiment, and may have various modifications.

The entire disclosure of Japanese Patent Application No. 2017-031655, filed Feb. 23, 2017 is expressly incorporated by reference herein.

What is claimed is:

1. A circuit device comprising:
an A/D conversion circuit configured to perform A/D conversion on a temperature detection voltage from a temperature sensor so as to output temperature detection data; and
a digital signal processing circuit configured to perform a temperature compensation process based on the temperature detection data,
wherein the A/D conversion circuit
operates in a first mode so as to obtain the temperature detection data by performing an A/D conversion process according to a first A/D conversion method, and
switches to a second mode so as to obtain the temperature detection data by performing an A/D conversion process according to a second A/D conversion method which is different from the first A/D conversion method in a case where a predetermined condition is established,
wherein, in a case where the minimum resolution of data in A/D conversion is indicated by LSB, the first A/D conversion method is a process of obtaining the temperature detection data such that a change in the temperature detection data at a second output timing following a first output timing with respect to the temperature detection data at the first output timing is equal to or less than k×LSB (where k is a positive integer satisfying k<j; and j is a positive integer representing a resolution in A/D conversion).

2. The circuit device according to claim 1,
wherein the A/D conversion circuit includes
a register portion in which intermediate result data or final result data is stored as result data,
a D/A converter that performs D/A conversion on the result data so as to output a D/A conversion voltage,
a comparison circuit that compares the temperature detection voltage from the temperature sensor with the D/A conversion voltage from the D/A converter, and
a processing circuit that performs a determination process on the basis of a comparison result in the comparison circuit, and performs an update process of the result data on the basis of the determination process,
wherein the processing circuit outputs the final result data which is a result of the update process as the temperature detection data.

3. The circuit device according to claim 2,
wherein the second A/D conversion method is a process in which the determination process is performed on an MSB side of the result data in a first determination period, and the determination process on an LSB side of the result data is performed in a second determination period which is longer than the first determination period.

4. An electronic apparatus comprising the circuit device according to claim 2.

5. A vehicle comprising the circuit device according to claim 2.

6. The circuit device according to claim 1, further comprising:
an interface; and
a storage unit to which circuit constant setting information of the circuit device is written via the interface,
wherein the A/D conversion circuit switches to the second mode in a case where the circuit constant setting information is written via the interface.

7. The circuit device according to claim 6,
wherein the circuit constant setting information is at least one of reference voltage adjustment information, reference current adjustment information, and oscillation frequency adjustment information.

8. The circuit device according to claim 6,
wherein the A/D conversion circuit switches to the second mode on the basis of a switching signal from the interface.

9. The circuit device according to claim 1, further comprising:
an interface,
wherein the A/D conversion circuit switches to the second mode in a case where a command for switching to the second mode is input via the interface.

10. The circuit device according to claim 1,
wherein the A/D conversion circuit includes a temperature change detection circuit, and switches to the second mode in a case where a predetermined temperature change is detected by the temperature change detection circuit.

11. The circuit device according to claim 1,
wherein the A/D conversion circuit switches to the second mode in a case where the predetermined condition is established, and switches to the first mode after the temperature detection data which is an A/D conversion result in the second mode is output.

12. The circuit device according to claim 1,
wherein the A/D conversion circuit
operates in the second mode in an activation period, and switches to the first mode after the temperature detection data which is an A/D conversion result in the second mode is output, and
switches to the second mode in a case where the predetermined condition is established after switching to the first mode occurs.

13. The circuit device according to claim 1, further comprising:
an oscillation signal generation circuit
wherein the digital signal processing circuit performs a temperature compensation process on an oscillation frequency from the oscillation signal generation circuit on the basis of the temperature detection data, and outputs frequency control data of the oscillation frequency, and
wherein the oscillation signal generation circuit generates an oscillation signal with the oscillation frequency set by the frequency control data by using the frequency control data from the digital signal processing circuit and a resonator.

14. An oscillator comprising:
the circuit device according to claim 13; and
the resonator.

15. An electronic apparatus comprising the circuit device according to claim 1.

16. A vehicle comprising the circuit device according to claim 1.

17. A manufacturing method for a circuit device which performs A/D conversion on a temperature detection voltage from a temperature sensor, so as to output temperature detection data, and includes an A/D conversion circuit, a storage unit, and an interface, the method comprising:
performing measurement for determining circuit constant setting information; and
causing an operation of the A/D conversion circuit to switch from a first mode in which an A/D conversion process is performed according to a first A/D conversion method in order to obtain the temperature detection data to a second mode in which an A/D conversion process is performed according to a second A/D conversion method which is different from the first A/D conversion method in order to obtain the temperature detection data, when the circuit constant setting information is written to the storage unit via the interface on the basis of a result of the measurement,
wherein, in a case where the minimum resolution of data in A/D conversion is indicated by LSB, the first A/D conversion method is a process of obtaining the temperature detection data such that a change in the temperature detection data at a second output timing following a first output timing with respect to the temperature detection data at the first output timing is equal to or less than k×LSB (where k is a positive integer satisfying k<j; and j is a positive integer representing a resolution in A/D conversion).

18. A circuit device comprising:
an A/D conversion circuit configured to perform A/D conversion on a temperature detection voltage from a temperature sensor so as to output temperature detection data; and
a digital signal processing circuit configured to perform a temperature compensation process based on the temperature detection data,
wherein the A/D conversion circuit
operates in a first mode so as to obtain the temperature detection data by performing an A/D conversion process according to a first A/D conversion method, and
switches to a second mode so as to obtain the temperature detection data by performing an A/D conversion process according to a second A/D conversion method which is different from the first A/D conversion method in a case where a predetermined condition is established,
wherein the A/D conversion circuit includes
a register portion in which intermediate result data or final result data is stored as result data,
a D/A converter that performs D/A conversion on the result data so as to output a D/A conversion voltage,
a comparison circuit that compares the temperature detection voltage from the temperature sensor with the D/A conversion voltage from the D/A converter, and
a processing circuit that performs a determination process on the basis of a comparison result in the comparison circuit, and performs an update process of the result data on the basis of the determination process,
wherein the processing circuit outputs the final result data which is a result of the update process as the temperature detection data.

19. An electronic apparatus comprising the circuit device according to claim.

20. A vehicle comprising the circuit device according to claim 18.

* * * * *